(12) United States Patent
Takeya et al.

(10) Patent No.: US 8,203,138 B2
(45) Date of Patent: Jun. 19, 2012

(54) ORGANIC FIELD-EFFECT TRANSISTOR, PRODUCTION METHOD AND INTERMEDIATE STRUCTURE THEREFOR, AND ORGANIC FIELD-EFFECT DEVICE

(75) Inventors: Junichi Takeya, Toyonaka (JP); Shimpei Ono, Tokyo (JP); Shiro Seki, Komae (JP)

(73) Assignees: National Institute of Japan Science and Technology Agency, Saitama (JP); Central Research Institute of Electric Power Industry, Tokyo (JP)

( * ) Notice: Subject to any disclaimer, the term of this patent is extended or adjusted under 35 U.S.C. 154(b) by 203 days.

(21) Appl. No.: 12/458,420

(22) Filed: Jul. 10, 2009

(65) Prior Publication Data

US 2010/0051913 A1    Mar. 4, 2010

Related U.S. Application Data

(63) Continuation-in-part of application No. PCT/JP2008/065700, filed on Sep. 1, 2008.

(30) Foreign Application Priority Data

Jan. 11, 2008 (JP) ................................. 2008-004629
Jan. 11, 2008 (JP) ................................. 2008-004630

(51) Int. Cl.
*H01L 35/24* (2006.01)
(52) U.S. Cl. .................................. 257/40; 257/E51.001
(58) Field of Classification Search .................... 257/40, 257/E51.001
See application file for complete search history.

(56) References Cited

U.S. PATENT DOCUMENTS

| 2003/0085398 A1* | 5/2003 | Koyama et al. | ................ 257/40 |
| 2006/0160276 A1* | 7/2006 | Brown et al. | ................ 438/149 |
| 2008/0001142 A1* | 1/2008 | Cho et al. | ........................ 257/40 |
| 2008/0111130 A1  | 5/2008 | Okuyama | |

FOREIGN PATENT DOCUMENTS

JP    A-2008-122649    5/2008

OTHER PUBLICATIONS

Hirahara et al., "Positioning ionic liquid on organic single-crystals for EDL, transistors with a PDMS local structure," 68th Extended Abstracts, The Japan Society of Applied Physics, 2007, No. 3, p. 1334 (w/ English-language translation).

(Continued)

*Primary Examiner* — Anthony Ho
(74) *Attorney, Agent, or Firm* — Oliff & Berridge, PLC

(57) ABSTRACT

An organic field-effect transistor normally includes: a source electrode and a drain electrode; an organic semiconductor layer in contact with the source electrode and the drain electrode; a gate insulating layer adjacent to the organic semiconductor layer; and a gate electrode in contact with the gate insulating layer. The gate insulating layer according to the present invention is in a liquid state, constituted with a material containing no glue or thickener, a sole or main component of which is an ionic liquid. Thus the capacitance of the ionic liquid corresponding to a gate voltage modulation frequency of 10 Hz is reduced to ¹⁄₁₀ at a frequency of 10 kHz of higher. As a result, an organic field-effect transistor capable of operating at low voltage and assuring ample current gain and high-speed response (the capacitance of the ionic liquid corresponding to a gate voltage modulation frequency of 10 Hz is reduced to ¹⁄₁₀ at a frequency of 10 kHz of higher) is provided.

22 Claims, 17 Drawing Sheets

OTHER PUBLICATIONS

He et al., "Thermoreversible Ion Gels with Tunable Melting Temperatures from Triblock and Pentablock Copolymers," *Macromolecules*, 2008, vol. 41, No. 1, pp. 167-174.

Lee et al., "Ion Gel Gated Polymer Thin-Film Transistors," *Journal of the American Chemical Society*, 2007, vol. 129, No. 15, pp. 4532-4533.

Takeya et al., "High-density electrostatic carrier doping in organic single-crystal transistors with polymer gel electrolyte," *Applied Physics Letters*, 2006, vol. 88, pp. 112102-1-112102-3.

International Search Report issued in International Application No. PCT/JP2008/065700 on Nov. 18, 2008 (w/ English-language translation).

* cited by examiner

FIG.2A
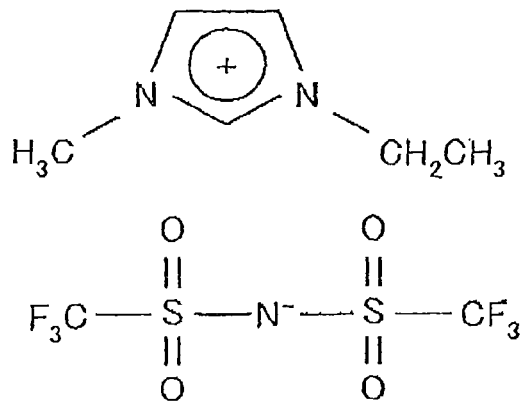
EMI(CF₃SO₂)₂N
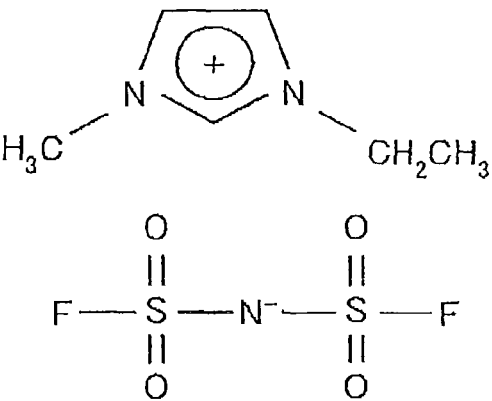
EMI(FSO₂)₂N
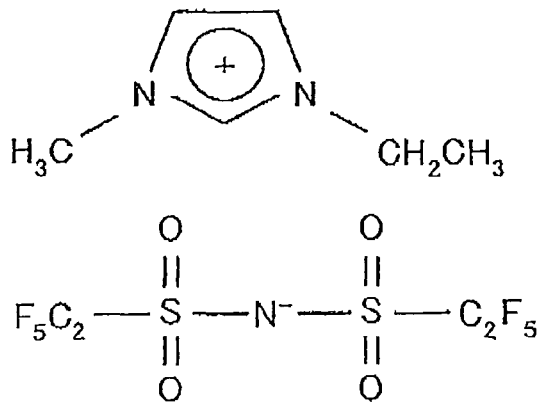
EMI(C₂F₅SO₂)₂N
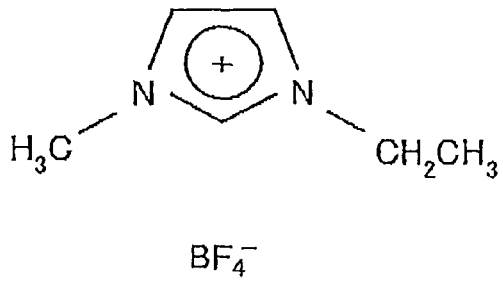
EMIBF₄⁻
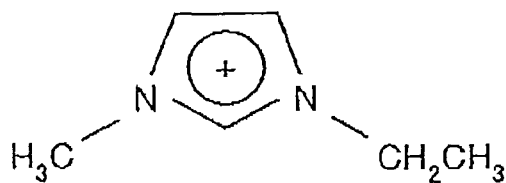
EMI(CN)₂N

FIG.2B
[P13][TFSI]
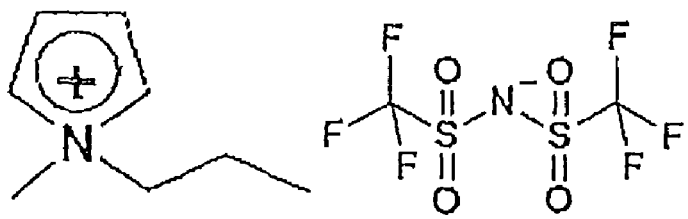
[P13][FSI]
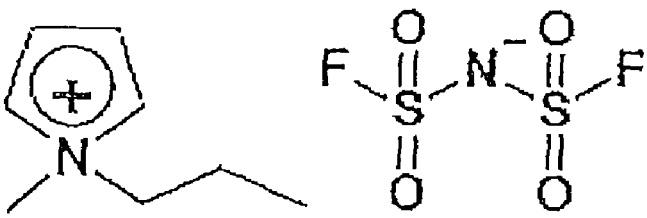
[PP13][TFSI]
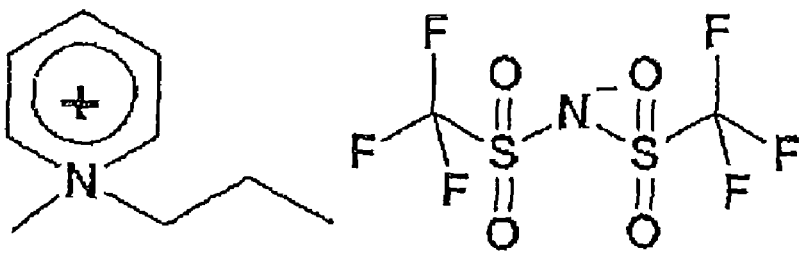
[TMBA][TFSI]
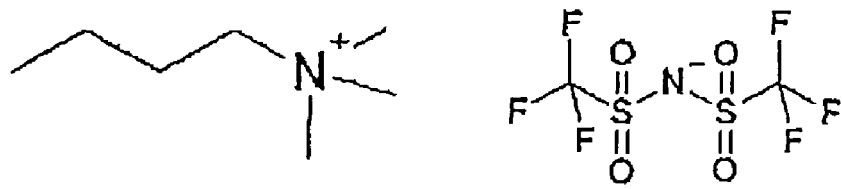
[TMPeA][TFSI]
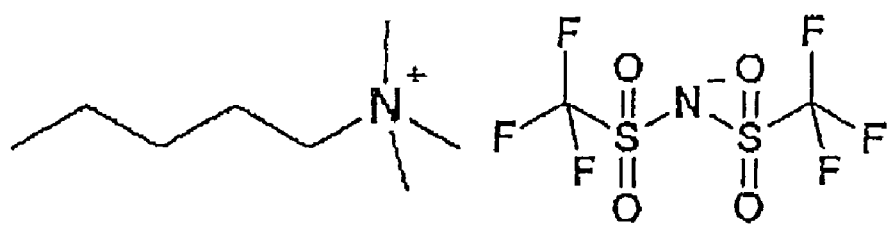

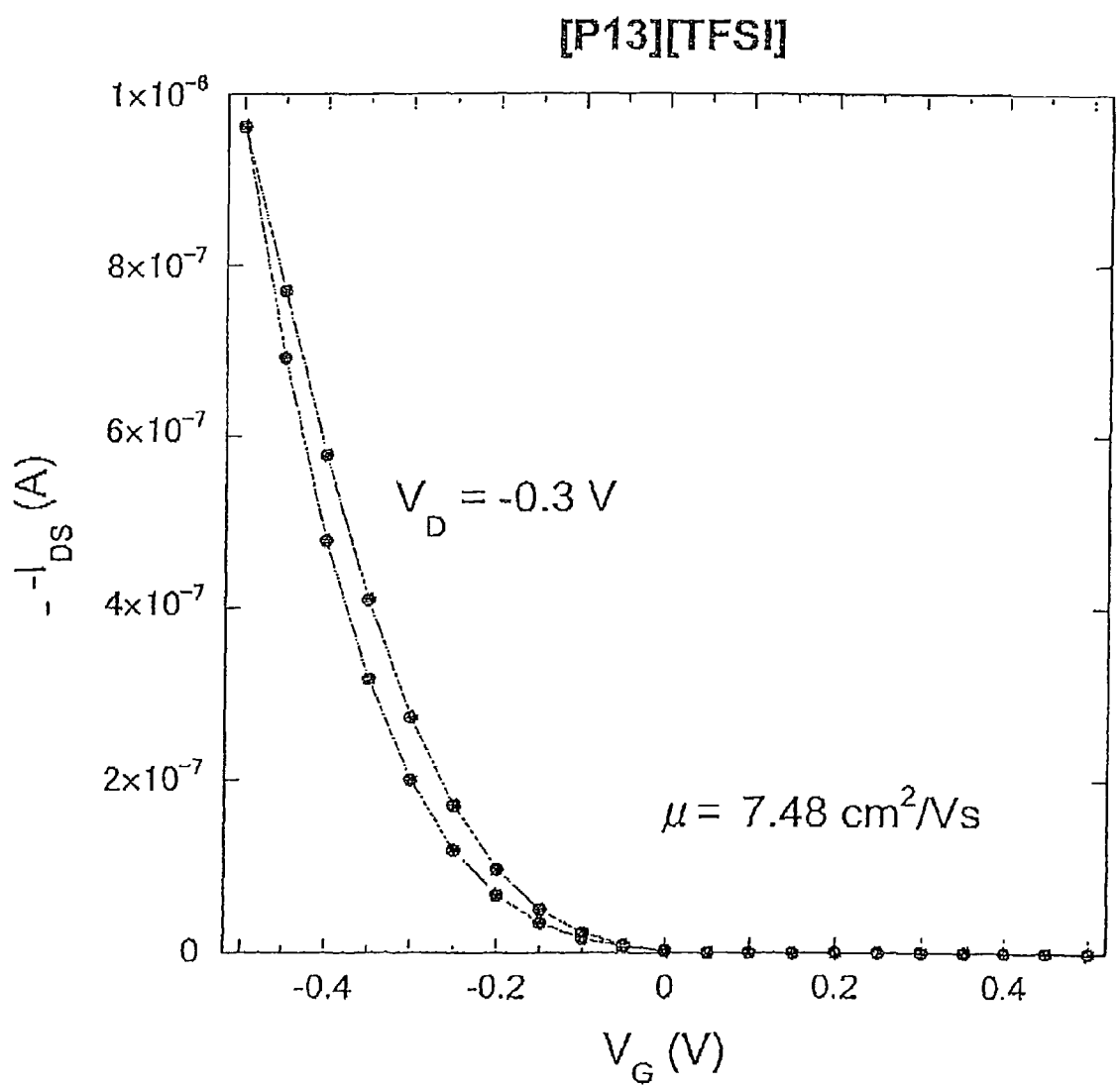

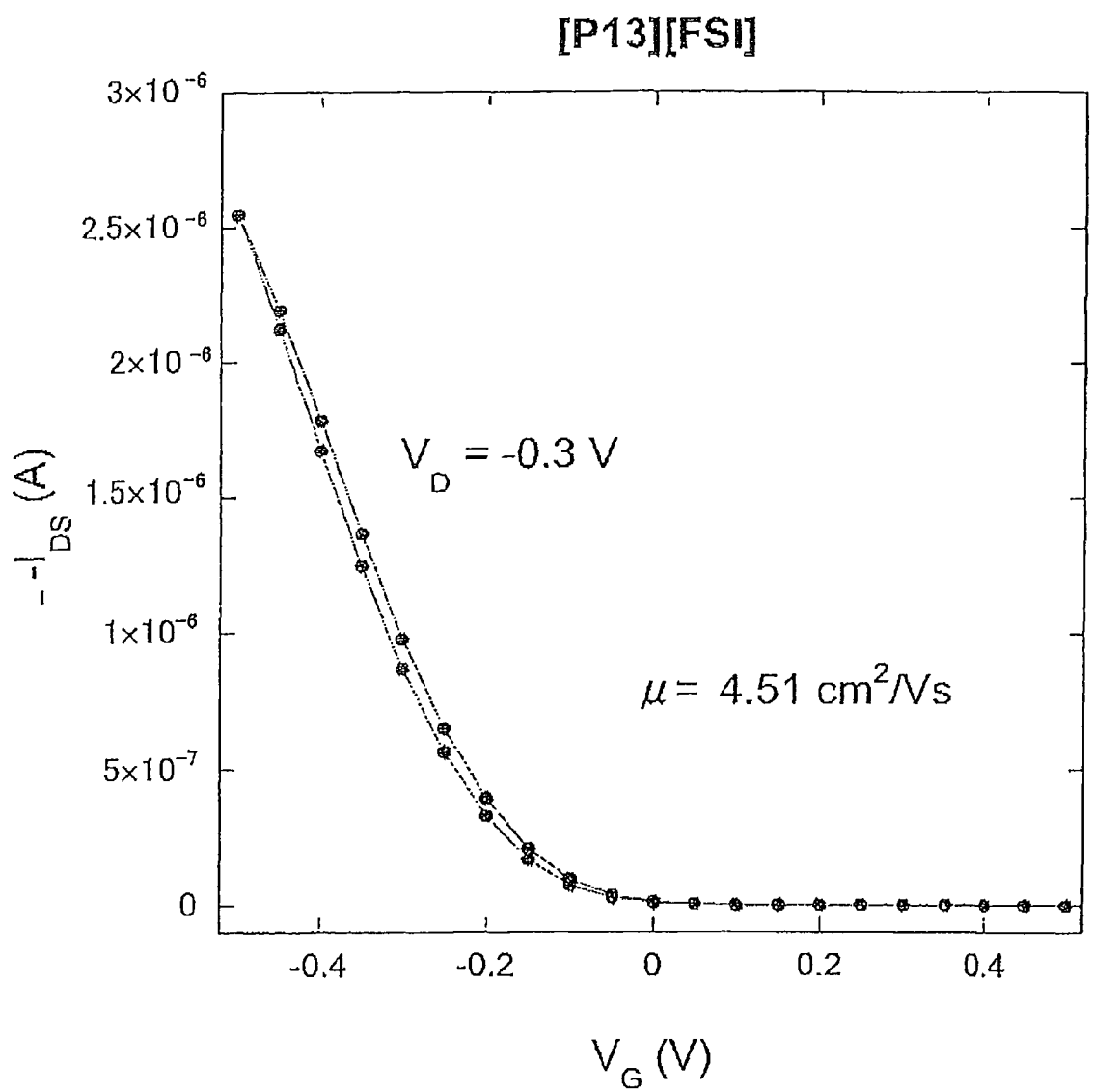

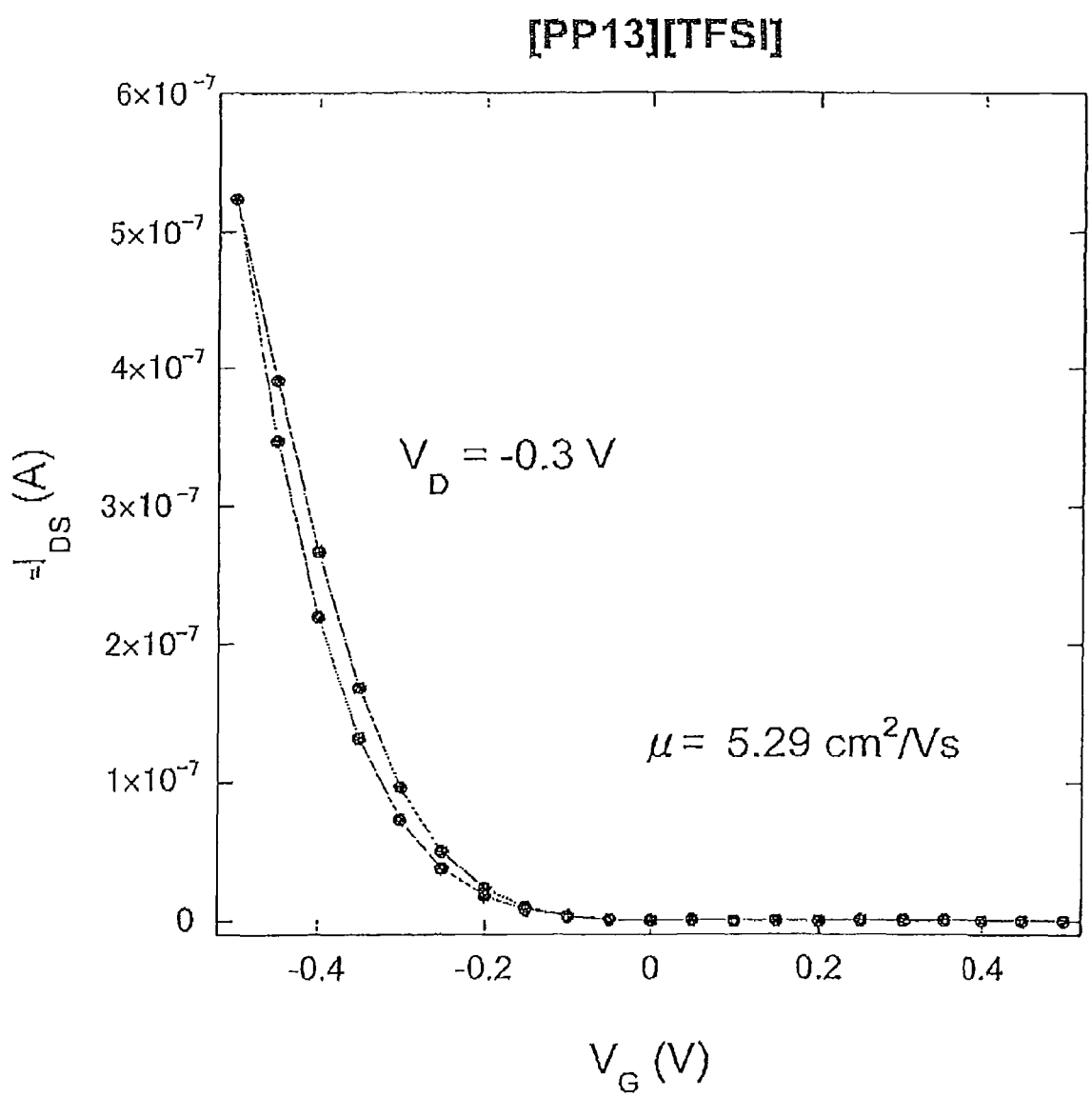

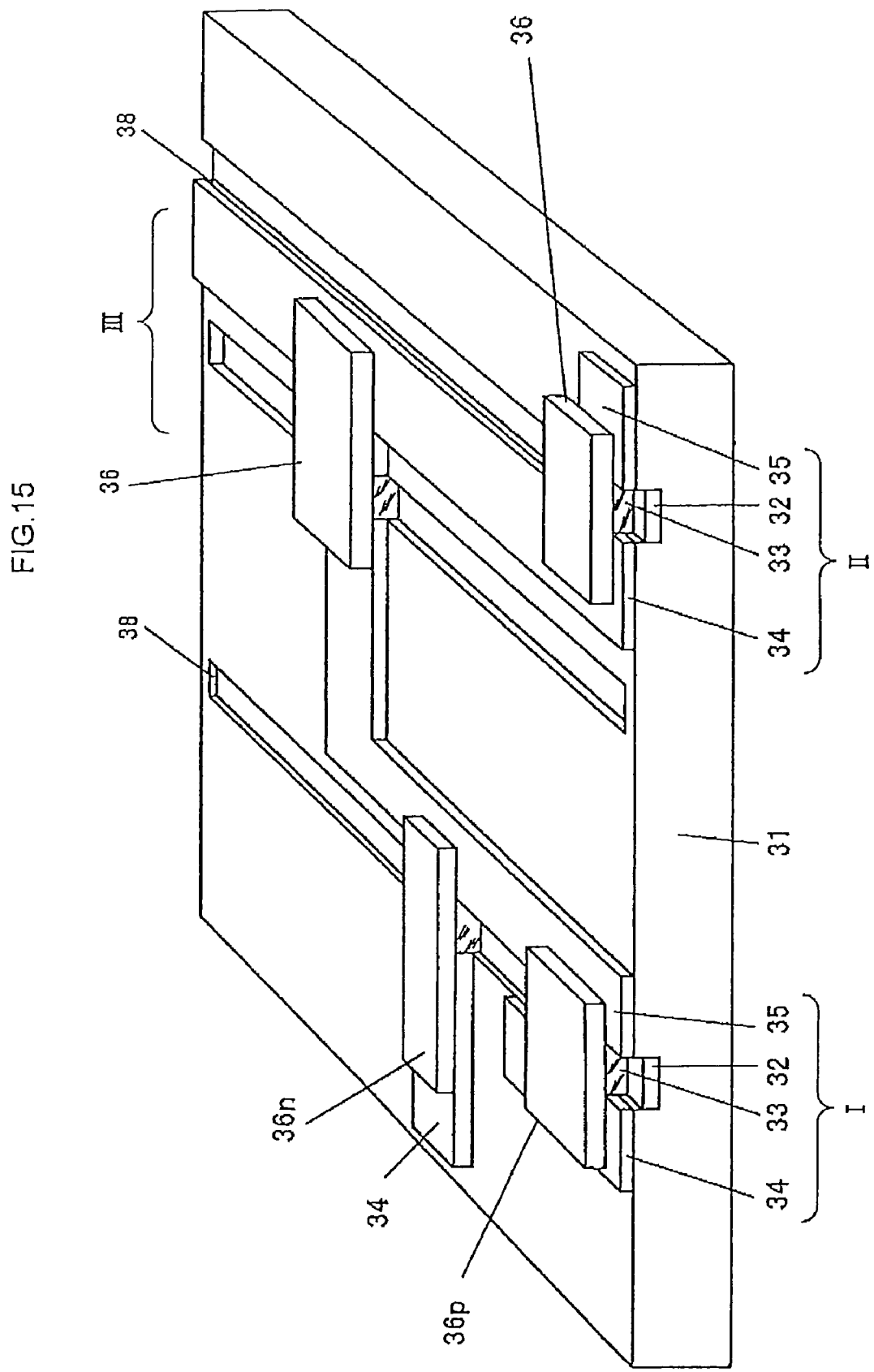

ORGANIC FIELD-EFFECT TRANSISTOR, PRODUCTION METHOD AND INTERMEDIATE STRUCTURE THEREFOR, AND ORGANIC FIELD-EFFECT DEVICE

CROSS REFERENCE TO RELATED APPLICATIONS AND INCORPORATION BY REFERENCE

This application is a continuation-in-part application of PCT/JP2008/065700 filed Sep. 1, 2008 designating the United States of America, the disclosure of which application is herein incorporated by reference.

Also, the disclosures of Japanese Patent Application No. 2008-004629 (filed Jan. 11, 2008) and Japanese Patent Application No. 2008-004629 (filed Jan. 11, 2008) are herein incorporated by reference.

BACKGROUND OF THE INVENTION

1. Field of the Invention

The present invention relates to an organic field-effect transistor provided with an organic semiconductor layer and a gate insulating layer. It also relates to a production method and an intermediate structure (structural body) for such an organic field-effect transistor as well as to an organic field-effect device. More particularly, the present invention relates to an organic field-effect transistor that operates at a low drive voltage and yet assures a sufficiently high current gain and a high-speed response. The transistor according to the present invention can be used as an amplifying element that amplifies current flowing between source and drain electrodes or a switching element that turns ON/OFF the flow of such current.

2. Description of Related Art

A field-effect transistor includes a source electrode, a drain electrode, a semiconductor layer in contact with the source and drain electrodes, a gate insulating layer adjacent to the semiconductor layer, and a gate electrode in contact with the gate insulating layer.

In recent years, extensive studies have been conducted on organic field-effect transistors with organic semiconductors instead of inorganic semiconductors and the gate insulating layers thereof constituted with electrolytes instead of dielectric materials. Organic transistors are advantageous since they are not only light in weight but are also thin and flexible so that they can be bent. Accordingly, the organic transistors are expected to expand applications of transistors.

Also, studies have been conducted on a polymer gel electrolyte comprised of polymer gel (polyethylene glycol) and Li ions (see. for example, J. Takeya et al., Appl. Phys. Lett. 88, 112102 (2006)) (hereafter referred to as "Polymer Gel Electrolyte I"). The polymer gel serves as glue or thickener. The Polymer Gel Electrolyte I is not liquid but paste-like.

It has been observed that the application of a voltage to the Polymer Gel Electrolyte I causes ions to move, resulting in the formation of a layer in which positive ions are accumulated and a layer in which negative ions are accumulated over a region having a thickness of about 1 nm from the electrodes which, together, form layers in which the balance between positive and negative charges is lost (electric-double layers). In these layers, the electric field is concentrated in a region with a thickness of about 1 nm from the surface of the semiconductor. As a result, even when a voltage as low as 1 V is applied between the gate electrode and the source electrode (or the drain electrode), an electric field as strong as 10 MV/cm is applied in the layers. Accordingly, when the Polymer Gel Electrolyte I is used as the gate insulating layer of a transistor, a stronger electric field can be applied to it at a lower voltage. As a result, many carriers are injected into the gate insulating layer. A high current gain can be achieved even at a low drive voltage in such a transistor.

In the meantime, there has been proposed an organic field-effect transistor with a gate insulating layer made of a polymer gel electrolyte comprised of a polymer gel and an ionic liquid (for example, 1-butyl-3-methylimidazolium hexafluorophosphate) (hereafter, referred to as "Polymer Gel Electrolyte II") (Jiyoul Lee et al., "Ion Gel Gated Polymer Thin-Film Transistor" J. Am. Chem. Soc. 129 (2007) 4532), instead of Li ion.

SUMMARY OF THE INVENTION

However, the organic field-effect transistor with a gate insulating layer of Polymer Gel Electrolyte II has low response speed and while it provides a relatively high current gain, it remains insufficient and a further improvement is required.

It is an object of the present invention to provide a responsive organic field-effect transistor that operates at a low voltage and provides a high current gain and a high response speed.

It is another object of the present invention to provide a method for producing such an organic field-effect transistor. It is yet another object of the present invention to provide an intermediate structure for producing such an organic field-effect transistor. It is yet another object of the present invention to provide an organic field-effect device.

The inventors of the present invention have conducted extensive studies and have found that a transistor achieving the objects can be obtained by using a liquid-state electrolyte, a sole or main component of which is an ionic liquid and which preferably is free of glue or thickener, which may be referred to as an "ionic liquid electrolyte", instead of the polymer gel electrolyte as a material for the gate insulating layer. The present invention has been accomplished based on this finding.

The present invention provides a field-effect transistor comprising: an organic semiconductor and a gate insulating layer. The gate insulating layer is in a liquid state, a sole or main component of which is an ionic liquid.

The present invention provides a field-effect transistor comprising: an organic semiconductor layer and a gate insulating layer. The gate insulating layer in the field-effect transistor is in a liquid state and is constituted of an ionic liquid as a sole or main component thereof. The field-effect transistor assumes a frequency (hereafter, referred to as a "specific frequency") of 10 kHz or higher, at which the capacitance of the ionic liquid corresponding to a gate voltage modulation frequency of 10 Hz is reduced to $\frac{1}{10}$.

The present invention provides a field-effect transistor comprising: a source electrode, a drain electrode, an organic semiconductor layer in contact with the source electrode and the drain electrode, a gate insulating layer adjacent to the organic semiconductor layer, and a gate electrode in contact with the gate insulating layer. The gate insulating layer in the field-effect transistor is in a liquid state, preferably without any glue or thickener and is constituted of an ionic liquid as a sole or main component thereof. The field-effect transistor assumes a specific frequency of 10 kHz or higher.

The present invention provides a field-effect transistor comprising: a source electrode, a drain electrode, an organic semiconductor layer in contact with the source electrode and the drain electrode, a gate electrode disposed separated from the organic semiconductor layer over a specific gap, which is determined such that capillary force can be achieved, and a gate insulating layer that fills the gap. The gate insulating layer in the field-effect transistor is in a liquid state, preferably free of glue or thickener, constituted of an ionic liquid, as a sole or main component thereof. The field-effect transistor assumes a specific frequency of 10 kHz or higher.

The present invention provides a method for producing a field-effect transistor, comprising: preparing an intermediate structure that includes a source electrode, a drain electrode, an organic semiconductor layer in contact with the source electrode and the drain electrode, and a gate electrode disposed separated over a specific gap, which is determined such that capillary force can be achieved; filling the gap with a liquid electrolyte, preferably free of glue or a thickener and constituted of an ionic liquid as a sole or main component thereof to form a gate insulating layer, thereby producing a field-effect transistor assuming a specific frequency of 10 kHz or higher.

The present invention provides an intermediate structure comprising: a source electrode, a drain electrode, an organic semiconductor layer in contact with the source electrode and the drain electrode, and a gate electrode disposed separated from the organic semiconductor layer over a specific gap, which is determined such that capillary force can be achieved. The "predetermined gap is a gap with dimensions such that capillary force can be achieved for a liquid electrolyte, a sole or main component of which is an ionic liquid (i.e., the liquid-state electrolyte, a sole or main component of which is an ionic liquid is absorbed and held by capillary force in the gap) at a field-effect transistor fabricated using the intermediate structure.

The present invention also provides a method for producing a field-effect transistor, the method comprising: preparing an intermediate structure that includes a substrate having formed thereat a depressed area of a predetermined depth which is determined such that capillary force can be achieved, a source electrode and a drain electrode formed on a surface of the substrate on sides facing opposite each other across the depressed area, and a gate electrode formed on a bottom surface of the depressed area; placing a relatively large organic semiconductor layer above the depressed area, thereby electrically connecting the organic semiconductor layer with the source electrode and the drain electrode, forming a gap which is determined such that capillary force can be achieved between the organic semiconductor layer and the gate electrode; and filling the gap with a liquid electrolyte, a sole or main component of which is an ionic liquid to form a gate insulating layer, thereby producing a field-effect transistor assuming a specific frequency of 10 kHz or higher.

The present invention provides an intermediate structure comprising a substrate having formed thereat a depressed area assuming a predetermined depth which is determined such that capillary force can be achieved for a liquid electrolyte, a sole or main component of which is an ionic liquid, a source electrode and a drain electrode formed on a surface of the substrate and on opposite sides of the depressed area, and a gate electrode formed on a bottom surface of the depressed area.

The substrate is preferably elastic.

The present invention provides an organic semiconductor element, such as an amplifying element or a switching element that includes a field-effect transistor, details of which are provided above.

The present invention provides a composite circuit comprising a substrate and a plurality of the field-effect elements, details of which are provided above.

BRIEF DESCRIPTION OF THE DRAWINGS

FIG. 2A shows chemical formulae structures of specific examples of ionic liquids that include $EMI(CF_3SO_2)_2$ and $EMI(FSO_2)_2$ that can be used in the present invention;

FIG. 2B shows other specific examples of ionic liquids that can be used in the present invention;

FIGS. 12A to 12E are graphs each illustrating the transfer characteristics of the transistor achieved in the second embodiment produced using other ionic liquids;

FIG. 15 is a conceptual illustration of a composite circuit, which is an application of the organic field-effect device according to the present invention.

DESCRIPTION OF PREFERRED EMBODIMENTS

Preferred embodiments of the field-effect transistor according to the present invention will be described in detail referring to the attached drawings. However, the present invention is not limited thereto.

Figure 1:
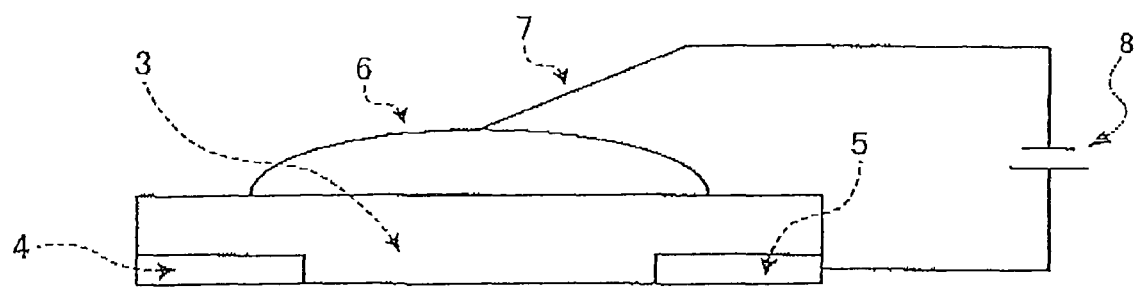
FIG. 1 is a conceptual illustration schematically showing the structure of the organic field-effect transistor achieved in an embodiment of the present invention.

FIG. 1 is a conceptual illustration of the structure of the organic field-effect transistor achieved in an embodiment of the present invention. As shown in FIG. 1, the organic field-effect transistor according to the present invention includes a source electrode 5, a drain electrode 4, an organic semiconductor layer 3 in contact with these electrodes, a gate insulating layer 6, adjacent to the organic semiconductor layer 3, and a gate electrode 7 in contact with the gate insulating layer 6. The gate insulating layer 6 is in a liquid state. The liquid gate insulating layer 6 may consist of an ionic liquid alone or it may be a composition of an ionic liquid and one or more other components as long as the insulating layer 6 remains in a liquid state. Reference numeral 8 denotes a power source.

The present invention imposes no particular restrictions with respect to the type of organic semiconductor used therein. For instance, the following materials can be used.
(1) Oligoacene molecules such as pentacene, tetracene, and anthracene;
(2) Oligoacene derivative molecules such as rubrene, tetramethylpentacene, tetrachloropentacene, and diphenylpentacene;
(3) Oligothiophene molecules such as sexithiophene, and derivative molecules thereof;
(4) TCNQ (7,7,8,8-tetracyanoquinodimethane) and derivative molecules thereof;
(5) TIF (1,4,5,8-tetrathiafluvalene) and derivative molecules thereof;
(6) Perylenes and derivative molecules thereof;
(7) Pyrenes and derivative molecules thereof;
(8) Other fullerenes such as C-60 and derivative molecules thereof;
(9) Phthalocyanine, metal phthalocyanines such as copper phthalocyanine and derivative molecules thereof;
(10) Porphyrine, metal porphyrines such as zinc porphyrine and iron porphyrine and derivative molecules thereof; and
(11) BEDT-TIF (bisethylenedithiotetrathiofluvalene) and derivative molecules thereof.

Of these, rubrene and pentacene are preferred.

Ionic liquids are in the liquid state at room temperature. In an embodiment of the present invention, an ionic liquid in the liquid state is used directly to form the gate insulating layer. The gate insulating layer is also in the liquid state substantially having the viscosity or fluidity of oil or water. It is desirable that the gate insulating layer have a viscosity of 150 mPas (millipascals per second) or less at room temperature.

Thus, use of the ionic liquid endows the transistor with high response speed. It is preferred that the ionic liquid should contain neither glues nor thickeners. If such an agent is mixed in with the ionic liquid, the gate insulating layer may turn pasty rather than remaining in the liquid state. However, a small amount of glue or a thickener may be mixed with the ionic liquid so long as the response speed of the transistor is not compromised.

An additional advantage of sustaining the gate insulating layer in the liquid state is that a sufficiently high current gain can be obtained. The gate insulating layer in the liquid state assures better contact with the surface of the organic semiconductor (which has minute depressions and protrusions at the surface thereof). Such improved contact between the organic semiconductor layer and the gate insulating layer will contribute to enhanced current gain.

Namely, since the ionic liquid is dispersed over an organic semiconductor layer with a complex surface texture, the organic semiconductor does not have to be flat, unlike when solid insulating layers are used. Therefore, the use of ionic liquids as the gate insulating layer facilitates the production of field-effect transistors.

According to the present invention, the insulating layer in the liquid state is also advantageous in that the organic semiconductor is more resistant to mechanical damage on its surface upon contact with the insulating layer than is the case at the interface between an organic semiconductor and a solid. This gives rise to superior electrical conductivity (high mobility) when carriers are introduced onto the surface of the organic semiconductor, thus providing improved current gain.

Any ionic liquid may be used in the present invention as long as the organic semiconductor layer remains undissolved. For instance, any of various compounds obtainable by combination of cations and anions listed below may be used.
(1) Cations
Imidazolium cations: 1-methyl-3-methylimidazolium (MMI), 1-ethyl-3-methylimidazolium (EMI), 1-propyl-3-methylimidazolium (PMI), 1-butyl-3-methylimidazolium (BMI), 1-pentyl-3-methylimidazolium (PeMI), 1-hexyll-3-methylimidazolium (HMI), 1-octyl-3-methylimidazolium (OMI), 1,2-dimethyl-3-propylimidazolium (DMPI);
Pyrrolidinium cations: 1-methyl-1-propylpyrrolidinium (P13), 1-methyl-1-butylpyrrolidinium (P14), 1-butyl-1-methylpyrrolidinium (BMP)
Piperidinium cations: 1-methyl-1-propylpiperidinium (PP13);
Ammonium cations: trimethyl propyl ammonium (TMPA), trimethyl octyl ammonium (TMOA), trimethyl hexyl ammonium (TMHA), trimethyl pentyl ammonium (TMPeA), trimethyl butyl ammonium (TMBA);
(2) Anions: bis(trifluoromethanesulfonyl)imide $((CF_3SO_2)_2N)$ (TFSI), bis(fluorosulfonyl)imide $((FSO_2)_2N)$ (FSI), bis(perfluoroethylsulfonyl)imide $((C_2F_5SO_2)_2N)$ (BETI), tetrafluoroborate ($BF_4$—) ($BF_4$), hexafluorophosphate ($PF_6$) (PF6), dicyanoamine (N≡C—N⁻—C≡N) (DCA).

Among the above-mentioned compounds, the ionic liquids (1) to (10) below are preferred.
(1) $EMI(CF_3SO_2)_2N$, i.e., 1-ethyl-3-methylimidazolium bis(trifluoromethanesulfonyl)imide
(2) $EMI(FSO_2)_2N$, i.e., 1-ethyl-3-methylimidazolium bis(fluorosulfonyl)imide
(3) $EMI(C_2F_5SO_2)_2N$, i.e., 1-ethyl-3-methylimidazolium bis(perfluoroethylsulfonyl)imide
(4) $EMIBF_4^-$, i.e., 1-ethyl-3-methylimidazolium tetrafluoroborate
(5) $EMI(CN)_2N$, i.e., 1-ethyl-3-methylimidazolium dicyanoamine
(6) [P13] [TFSI], i.e., 1-methyl-1-propylpyrrolidinium bis(trifluoromethanesulfonyl)imide
(7) [P13][FSI], i.e., 1-methyl-1-propylpyrrolidinium bis(fluorosulfonyl)imide
(8) [PP13] [TFSI], i.e., 1-methyl-1-propylpiperidinium bis(trifluoromethanesulfonyl)imide
(9) [TMBA][TFSI], i.e., trimethylbutylammonium bis(trifluoromethanesulfonyl)imide
(10) [TMPeA][TFSI], i.e., trimethylpentylammonium bis(trifluoromethanesulfonyl)imide FIGS. 2A and 2B show chemical structural formulae of the preferred specific examples of the ionic liquids listed above.

The ionic liquid may contain additives that can improve the performance (lower drive voltage, sufficiently high current gain, and high response speed). Such additives may be added to or dissolved into the ionic liquid in quantities small enough that the fluidity thereof will not be compromised. Examples of such additives include the following.

(1) Nano particles of inorganic oxides such as aluminum oxide, zirconium oxide, silicon oxide, and titanium oxide;
(2) Inorganic ions such as lithium ion, potassium ion, and sodium ion.

According to the present invention, the gate layer (electrode), the source layer (electrode), and the drain layer (electrode) can be formed by using a metal that is conventionally used in field-effect transistors, such as gold. The organic field-effect transistor shown in FIG. 1 includes a gold wire constituting the gate electrode. The drain electrode 4 and the source electrode 5 each include a thin, gold film.

The substrate used in the organic field-effect transistor according to the present invention may be any of substrates used in conventional field-effect transistors and particular in organic field-effect transistors, e.g., resin sheet, resin film, paper, glass, ceramic, metal, and alloys. In some cases, elastic substrates may be preferable.

Since the gate insulating layer according to the present invention is in the liquid state, it is desirable that a depressed area or a gap of a predetermined size be formed so as to hold the gate insulating layer in the intended shape. For this purpose, a substrate having a depressed area of a specific depth formed thereon which allows capillary force may be present.

Preferably, such a substrate may be elastic. A source electrode and a drain electrode are formed on a surface of the substrate so as to face opposite each other across the depressed area. Minute depressions and protrusions are also present at the surface of the organic semiconductor layer atop the source electrode and the drain electrode thereof. Thus, when the organic semiconductor layer is disposed over the source electrode and the drain electrode to electrically connect the organic semiconductor layer with the source electrode and the drain electrode, good electrical continuity cannot be assured. The use of an elastic substrate, however, results in an enhanced current gain. The improvement in current gain is assumed to be attributable to better electrical continuity brought on by tighter contact between the semiconductor layer and the source electrode and between the semiconductor layer and the drain electrode.

The transistor according to the present invention operates at a low drive voltage. When a voltage is applied to the transistor, electric-double layers are formed in the gate insulating layer. In addition, the transistor according to the present invention has a sufficiently high current gain and demonstrates high response speed. The response speed achieved in the present invention is evaluated in terms of a specific frequency, which is defined as "a frequency at which a capacitance corresponding to the gate voltage modulation frequency of 10 Hz is decreased to $1/10$". While the specific frequency is measured as a parameter that indicates the performance of the gate insulating layer, it is also considered to indicate the performance of the transistor, since the capacitance is affected by the structure of the transistor. According to the present invention, the response of the transistor is evaluated based on the specific frequency. The transistor according to the present invention assumes a specific frequency of 10 kHz or higher, which directly translates to high response speed.

The performance of the transistor (C) according to the present invention compares to that of the organic filed-effect transistors (transistor A that uses Polymer Gel Electrolyte I and transistor B that uses Polymer Gel Electrolyte II) in the related art as follows.

Transistor A: Low drive voltage (O)
  Low current gain (x)
  Low response speed (x)
Transistor B: Low drive voltage (O)
  High current gain (Δ)
  Low response speed (x)
Transistor C: Low drive voltage (O)
  Even higher current gain (O)
  High response speed (O)
(Notes: O: Excellent, Δ: Fair, x: Poor)

First Embodiment

Figure 3:
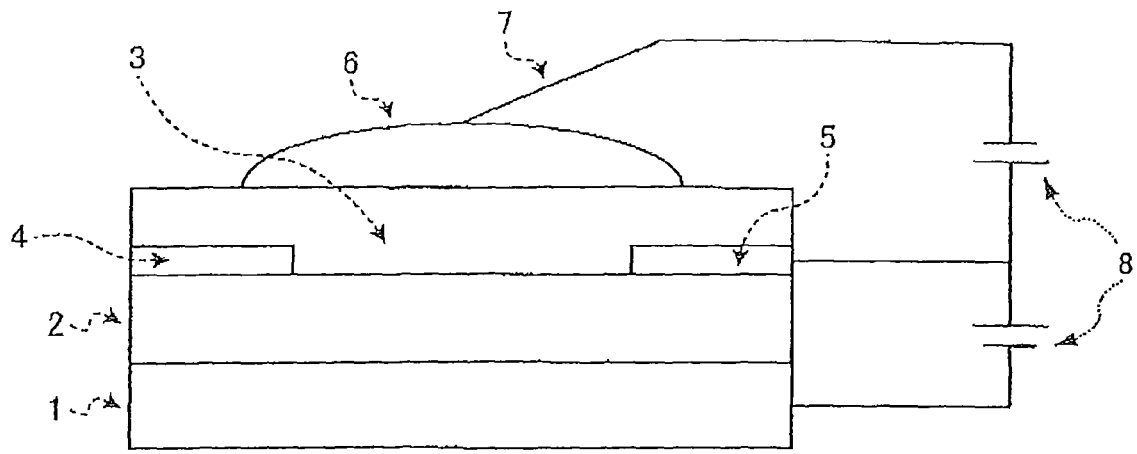
FIG. 3 is a conceptual diagram showing a dual-gated organic field-effect transistor used for purposes of measurement in a first embodiment of the present invention.

First, the structure of the dual-gated transistor achieved in the first embodiment of the present invention is described. FIG. 3 is a conceptual illustration of the structure adopted in the dual-gated transistor. The dual-gated transistor is made up with transistors each of which includes one of two different gate insulating layers, i.e., an upper gate insulating layer and a lower gate insulating layer. The transistor that utilizes the upper gate insulating layer relates to the present invention and the transistor that utilizes the lower gate insulating layer is a conventional transistor of the related art. Such a dual-gated transistor arrangement is adopted so as to facilitate coordination of the measurement conditions.

The transistor shown in FIG. 3 includes a lower gate electrode 1 constituted of doped silicon, a lower gate insulating layer 2 constituted of $SiO_2$ and formed on the lower gate electrode 1, a drain electrode 4 constituted of gold and formed on the lower gate insulating layer 2, a source electrode 5 constituted of gold and formed on the lower gate insulating layer 2, an organic semiconductor layer 3 constituted of an organic rubrene single crystal and formed over the lower gate insulating layer 2, a gate (upper gate) insulating layer 6 constituted of an ionic liquid and formed on the organic semiconductor layer 3, and a gate (upper gate) electrode 7 constituted with gold wire.

The gate insulating layer in the lower field-effect transistor, comprising the lower gate electrode 1, the lower gate insulating layer 2, the organic semiconductor layer 3, the drain electrode 4 and the source electrode 5, is constituted of $SiO_2$ in the related art.

The gate insulating layer in the upper field-effect transistor (an example of the transistor according to the present invention), comprising the (upper) gate electrode 7, the (upper) gate insulating layer 6, the organic semiconductor layer 3, the drain electrode 4 and the source electrode 5, on the other hand, is constituted of liquid.

Figure 4:
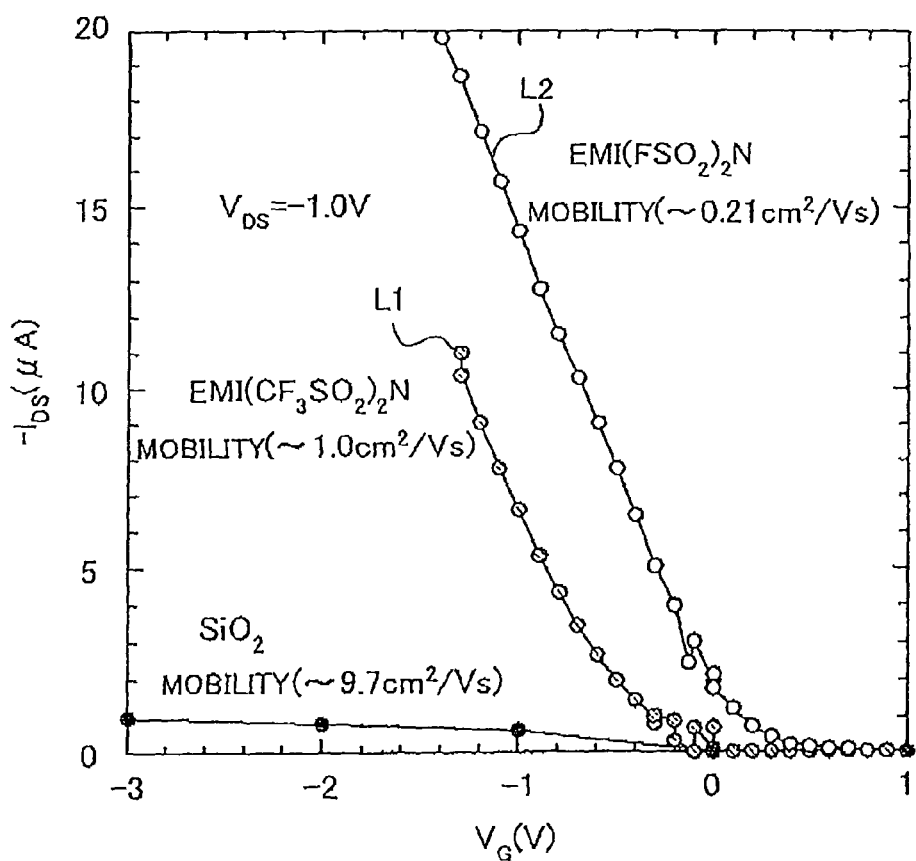
FIG. 4 is a graph illustrating a change in the drain current $I_{DS}$ relative to the gate voltage $V_G$ of the organic field-effect transistor achieved in the first embodiment.

Through such an ionic liquid as a sole or main component of the gate insulating layer, electric-double layers are formed at the upper transistor, over an interface between the ionic liquid and the semiconductor, as a gate voltage is applied between the gate electrode 7 and the source electrode 5 (or the drain electrode 4). This allows the transistor to operate at a low drive voltage. In comparison to conventional transistors of the related art that include a gate insulating layer constituted of the commonly used $SiO_2$ (which is not an electrolyte but is a dielectric material), the upper transistor allows a sufficiently large amount of current to flow at lower drive voltages, as shown in FIG. 4. In other words, the upper transistor assures a high current gain.

FIG. 4 is a graph illustrating a change in the drain current $I_{DS}$ (μA) relative to the gate voltage $V_G$ (V). L1 represents the change observed when $EMI(CF_3SO_2)_2N$ was used and L2 indicates a graph when $EMI(FSO_2)_2N$ was used. Filled circles (●) represents the change observed when at the lower transistor (with $SiO_2$ constituting the gate insulating layer). The voltage between the drain electrode and the source electrode was −1.0 V.

The following ionic liquids were used as the ionic liquids.
(1) $EMI(CF_3SO_2)_2N$, i.e., 1-ethyl-3-methylimidazolium bis (trifluoromethanesulfonyl)imide; and (2) EMI(FSO$_2$)$_2$N, i.e., 1-ethyl-3-methylimidazolium bis(fluorosulfonyl)imide.

It is to be noted that FIG. 2A presents the chemical structural formulae of the compounds EMI(CF$_3$SO$_2$)$_2$N and EMI(FSO$_2$)$_2$N.

By using an ionic liquid (electrolyte in the liquid state) to constitute the gate insulating layer as shown in FIG. 3, an ample current, which is larger than that achieved at a transistor having a gate insulating layer constituted of SiO$_2$ can be provided simply by applying a low switching voltage V$_G$ (i.e., the voltage between the gate electrode and the source electrode) to the gate electrode, as shown in FIG. 4. As a result, power consumption at the transistor decreases.

Figure 5A:
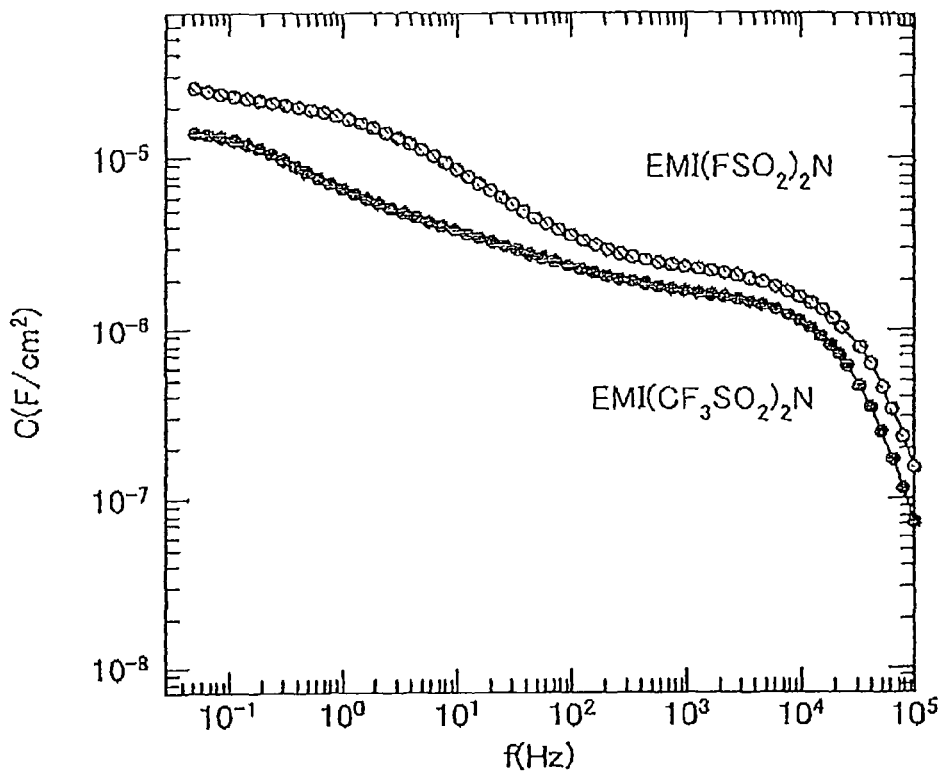
FIG. 5A is a graph illustrating the relationship between the capacitance C per unit area and the frequency f observed at the upper transistor (an example of the present invention) achieved in the first embodiment.

The upper transistor in the first embodiment demonstrates good response (frequency response). FIG. 5A is a graph illustrating the response of the upper transistor. Unfilled circles (◯) indicate the characteristics of a transistor with an EMI(FSO$_2$)$_2$N gate insulating layer. Filled circles (●) indicate the characteristics of a transistor with an EMI(CF$_3$SO$_2$)$_2$N gate insulating layer. The capacitance F/cm$^2$ per unit area is indicated along the vertical axis while the frequency (Hz) is indicated along the horizontal axis.

Figure 5B:
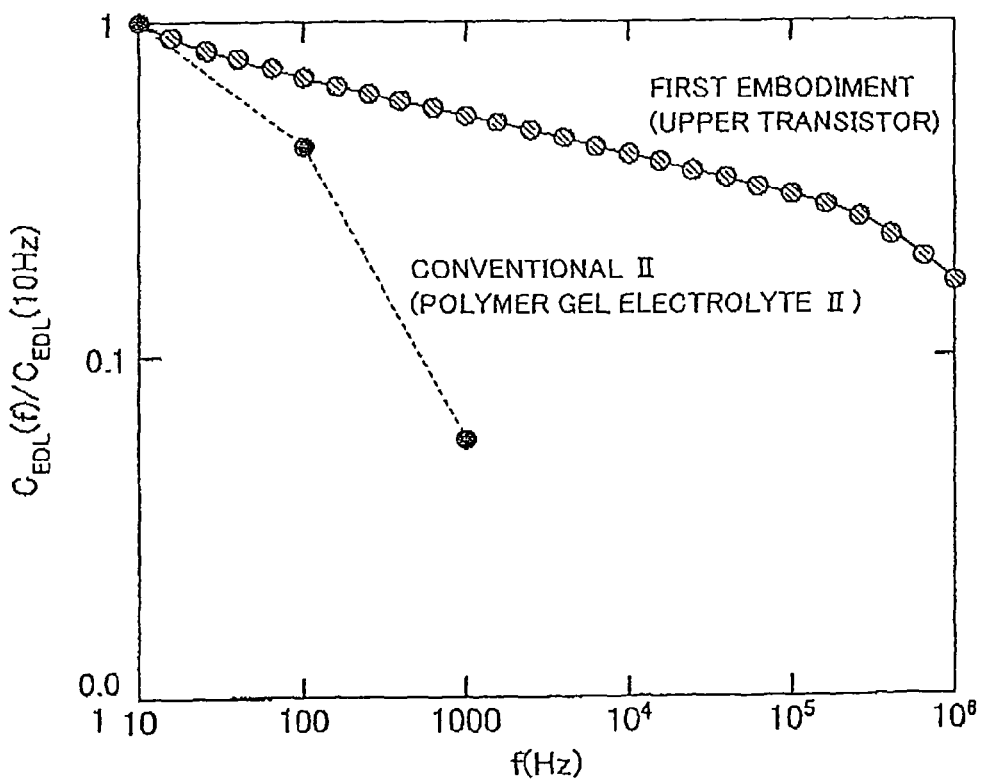
FIG. 5B is a graph illustrating the relationships between the capacitance per unit area (normalized by the capacitance per unit area at 10 Hz and the modulation frequency f observed for the upper transistor (an example of the present invention) achieved in the first embodiment and for a conventional transistor II using Polymer Gel Electrolyte II.

FIG. 5B also presents a similar response graph. The solid line represents the response characteristics of the upper transistor with an EMI(CF$_3$SO$_2$)$_2$N gate insulating layer adopting the structure in the first embodiment, whereas the broken line represents the response characteristics of a conventional example II in the known art (i.e., a transistor with Polymer Gel Electrolyte II constituting the gate insulating layer). The extent of change observed in capacitance per unit area at high frequency is identified along the vertical axis which assumes an increment unit matching the value calculated by normalizing the capacitance per unit area based upon a capacitance per unit area at 10 Hz.

The frequency (Hz) is indicated along the horizontal axis.

The two transistors assume the following specific frequencies. Higher specific frequencies corresponded to higher transistor response.

First embodiment: 10 MHz
Conventional II: 1 kHz

The sufficiently high current gain, which is one of advantageous effects of the present invention, is brought about by high carrier mobility. The carrier mobility is represented by a value obtained by dividing the inclination of the transfer characteristics curve (drain current relative to gate voltage) shown in FIG. 4 by the capacitance. FIGS. 4 and 5A show that the carrier mobility of EMI(CF$_3$SO$_2$)$_2$N is higher than the carrier mobility of EMI(FSO$_2$)$_2$N. Namely, the carrier mobility increases as the molecular size of the negative ions in the ionic liquid increases.

Compared to the Polymer Gel Electrolyte II, the upper transistor of the first embodiment demonstrated higher carrier mobility. In particular, when EMI(CF$_3$SO$_2$)$_2$N was used as the ionic liquid, a carrier mobility of 5.0 cm$^2$/Vs was obtained. In contrast, when the polymer gel electrolyte II was used, the carrier mobility obtained was as low as 1.0 cm$^2$/Vs.

Second Embodiment

Figure 6A:
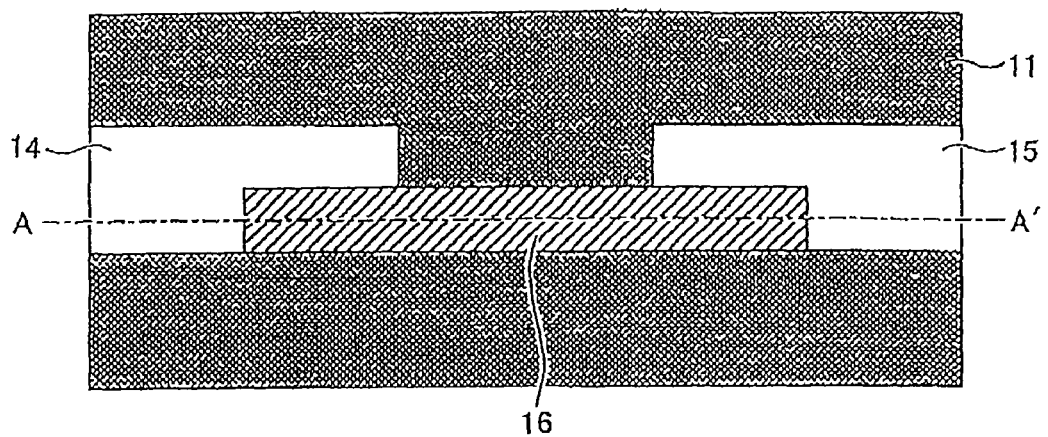
FIG. 6A is a conceptual plan view showing the structure of the organic field-effect transistor achieved in a second embodiment of the present invention.
Figure 6B:
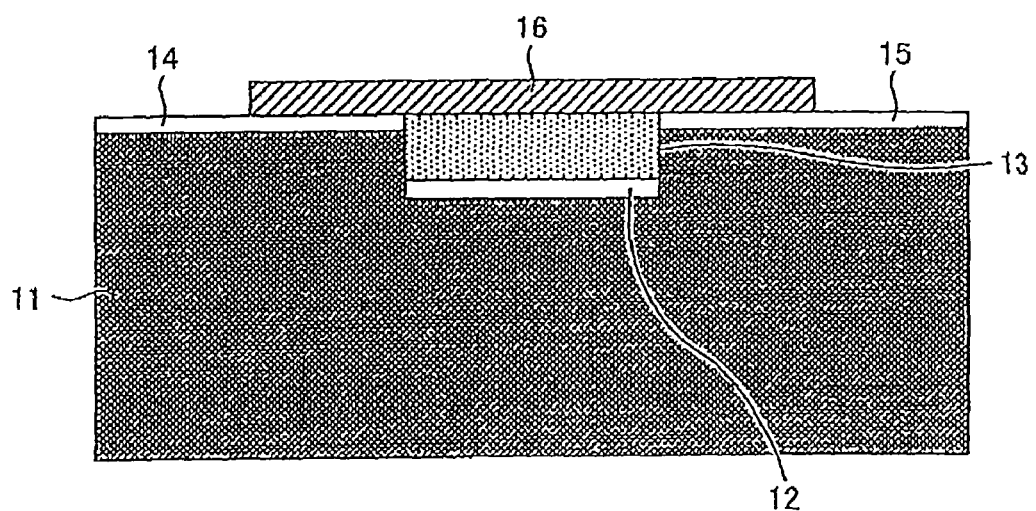
FIG. 6B is a sectional view taken along the line A-A' in FIG. 6A.
Figure 6C:
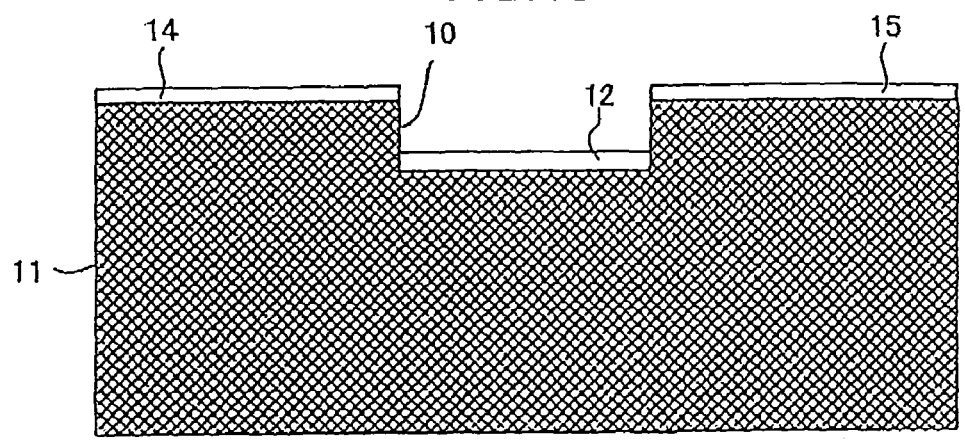
FIG. 6C is a sectional view of a depressed area on the substrate.

A gate insulating layer in the liquid state such as that described in reference to the first embodiment, must be held within the transistor by some means. Accordingly, in an organic field-effect transistor in a second embodiment, a depressed area for holding the gate insulating layer (liquid) in the intended shape, is described. The structure of such a transistor is explained in reference to FIGS. 6A, 6B, and 6C. FIG. 6A is a plan view. FIG. 6B is a cross-sectional view along the line A-A' in FIG. 306A and FIG. 6C is a reference diagram, illustrating a substrate having a depressed area at which the organic semiconductor layer and the gate insulating layer are to be formed. As shown in FIGS. 6B and 6C, the organic field-effect transistor includes a substrate 11 with a depressed area 10. The depressed area 10 assumes a predetermined depth (e.g., 0.1 µm to 100 µm). At the bottom of the depressed area 10, a gate electrode 12 is formed. The depressed area 10 is filled with an ionic liquid to function as a gate insulating layer 13.

At a surface of the substrate 11, a source electrode 14 and a drain electrode 15 such that the electrodes 14 and 15, each constituted with a thin gold film, are formed at positions facing opposite each other across the depressed area 10.

An organic semiconductor layer (organic rubrene single crystal) 16 ranging over an area larger than the depressed area 10 is placed over the depressed area 10. A left end region of the organic semiconductor layer 16 is in contact with the source electrode 14 and a right end region of the organic semiconductor layer 16 is in contact with the drain electrode 15. As a result, electric continuity is achieved between the organic semiconductor layer 16 and the source electrode 14 and between the organic semiconductor layer 16 and the drain electrode 15.

Figure 7:
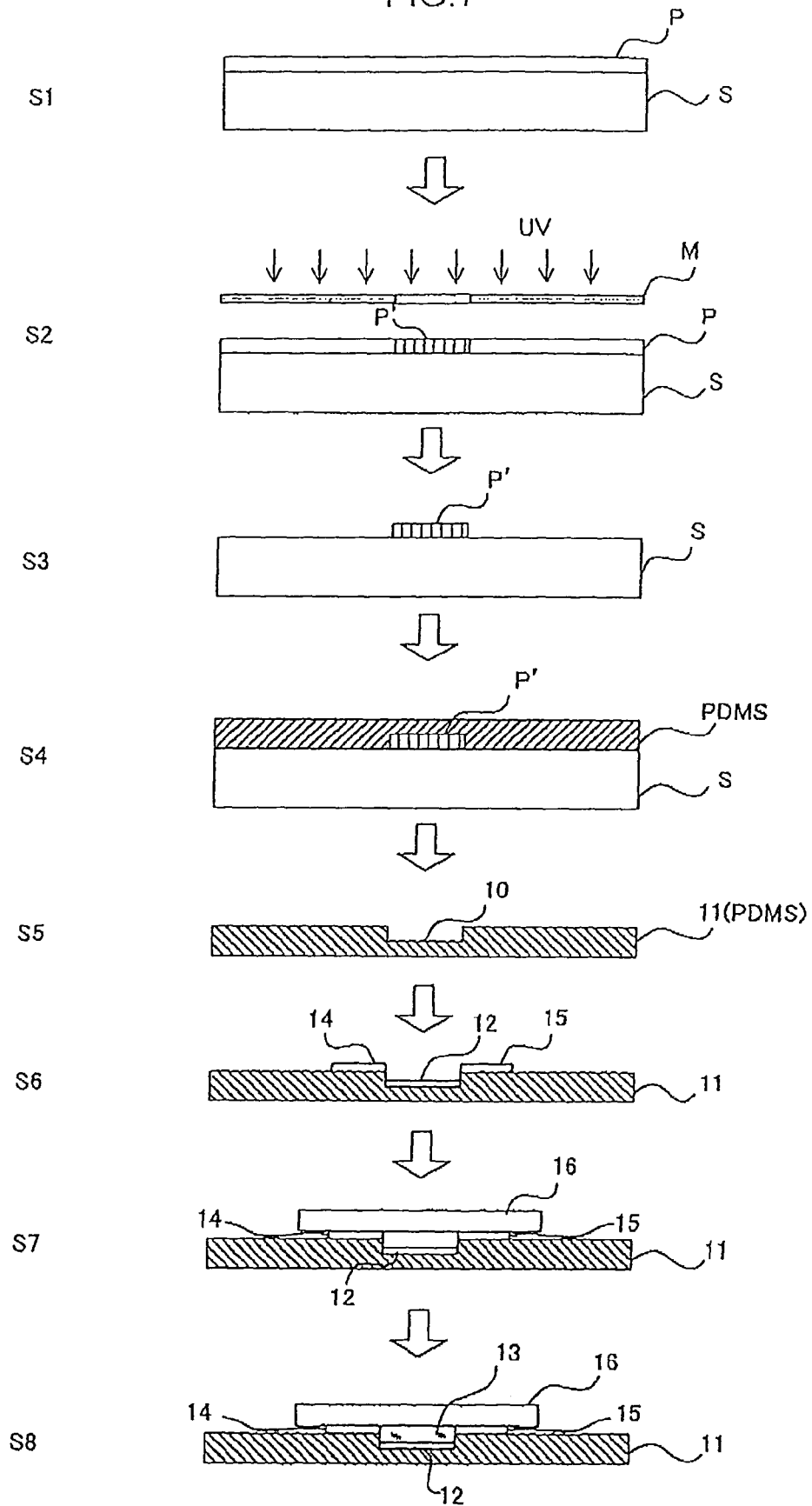
FIG. 7 is illustrates in sectional views, an embodiment of the method for producing an organic field-effect transistor by using a substrate with a depressed area according to the present invention.

A transistor having such a structure can be fabricated through the following procedure. FIG. 7 illustrates the production method.

As shown in FIG. 7, a silicon substrate coated with a photoresist P on one surface thereof is prepared (step S1). The photoresist is irradiated with ultraviolet (UV) light through a mask M with a predetermined pattern to expose the photoresist P in the predetermined pattern (step S2). The exposed portion of the photoresist P is thus hardened (hardened portion: P'). Then the unexposed portion of the photoresist P is dissolved with a solvent and removed (step S3). As a result, partially, a bare surface of the silicon substrate appears and the undissolved photoresist remaining on the substrate forms a protrusion P' assuming a specific height measuring from the substrate surface. The protrusion P' assumes the shape of a substantially rectangular parallelepiped having dimensions of, for example, 0.1 µm to 1 mm in width, 0.1 µm to 1 mm in length, and 0.1 µm to 100 µm in depth. The silicon substrate provided with the protrusions P' (hardened photoresist) is used as a mold or a template in the following step. It is to be noted that while the manufacturing steps are described above on the assumption that the photoresist is a negative photoresist, the protrusion may instead be formed with a positive photoresist, as will be obvious to persons skilled in the art.

Then, a prepolymer of poly-dimethylsiloxane (PDMS), which is a type of silicone rubber, and a hardener are readied. The prepolymer and the hardener are mixed and charged into the mold, which is then heated to cure the mixture and form silicone rubber (step S4). The silicone rubber is removed from the mold to obtain a substrate 11 with the depressed area 10 (step S5). The substrate 11 is elastic since it is made of silicone rubber.

Chromium and gold are sequentially deposited onto the depressed area 10 and peripheries through a mask, thereby forming a gate electrode 12, a source electrode 14 and a drain electrode 15, (step S6). An organic semiconductor layer (an organic rubrene single crystal) 16 ranging over an area larger than the depressed area 10 is disposed so as to cover the depressed area 10 (step S7). As a result, the depressed area 10 forms a gap of predetermined dimensions, which are determined such that capillary force can be achieved.

Finally, an ionic liquid is charged into the gap to form a gate insulating layer 13 (step S8). The ionic liquid in the gap is under the influence of capillary force and thus remains within the gap. The ionic liquid is a liquid that is substantially nonvolatile. The properties of the nonvolatile ionic liquid allow the gap to be open, but it is preferred, that the gap be sealed to create a closed system in view of practical considerations such as durability. The organic field-effect transistor according to the present invention is thus produced.

The closed system may be constituted by sealing the gap with any appropriate means. For instance, both ends of the gap forming a capillary tube or the like which is determined such that capillary force can be achieved may be sealed with an insulating adhesive that is insoluble in the ionic liquid. Alternatively, the gap may be sealed by attaching insulating plates to the ends of the gap forming the capillary tube.

The organic field-effect transistor according to the present invention can be manufactured by using an intermediate structure. For instance, it can be manufactured by using an intermediate structure prefabricated through step S6 in the process illustrated in FIG. 7, placing the organic semiconductor over the source electrode and the drain electrode, thereby transforming the depressed area 10 into a space where capillary force is achieved in step S7 and charging an ionic liquid or a compound, the main component of which is an ionic liquid into the space in step S8. Likewise, the organic field-effect transistor according to the present invention may be produced by charging an ionic liquid or a composition containing the ionic liquid as a main component into the intermediate structure prefabricated through step S7 (with a gap capable of exerting capillary force). The use of such an intermediate structure in the production of the organic field-effect transistor according to the present invention allows for a more efficient manufacturing process. The organic field-effect transistor according to the present invention can be produced with particular speed by immersing a large number of intermediate structural bodies simultaneously in the ionic liquid.

The use of a liquid electrolyte also facilitates a manufacturing process through which an integrated device is produced on a substrate, since a liquid electrolyte, a sole or main component of which is an ionic liquid can be delivered to and held securely in the spaces under the organic semiconductor layers at the various devices constituting the integrated device all at once simply by immersing the substrate in the liquid electrolyte. In addition, since the ionic liquid is held securely in the space directly under each organic semiconductor layer with capillary force exerted on the ionic liquid, no patterning step is required to, for instance, etch the insulating layer. The production efficiency in manufacturing the transistor is thus improved.

Methods of achieving contact and, therefore, electrical continuity between the organic semiconductor layer 16 and the source electrode 14 and between the organic semiconductor layer 16 and the drain electrode 15 simply by placing the organic semiconductor layer 16 upon the electrodes having been disclosed in the related art (see for instance, JP-A-2005-268715). The surfaces of the source and drain electrodes can be conditioned through, for instance, to molecular film coating. It is desirable that such a molecular film coating process be executed by using a thiol compound or a disulfide compound. Either of these compounds will be chemically attracted to the surface of a metal such as gold used as an ideal constituent of the source electrode and the drain electrode to form a dense, strong, ultra thin film (single molecule film). In the second embodiment, better contact is assured through mechanical compression of the organic semiconductor layer 16 against the substrate 11 constituted of silicone rubber.

Figure 8:
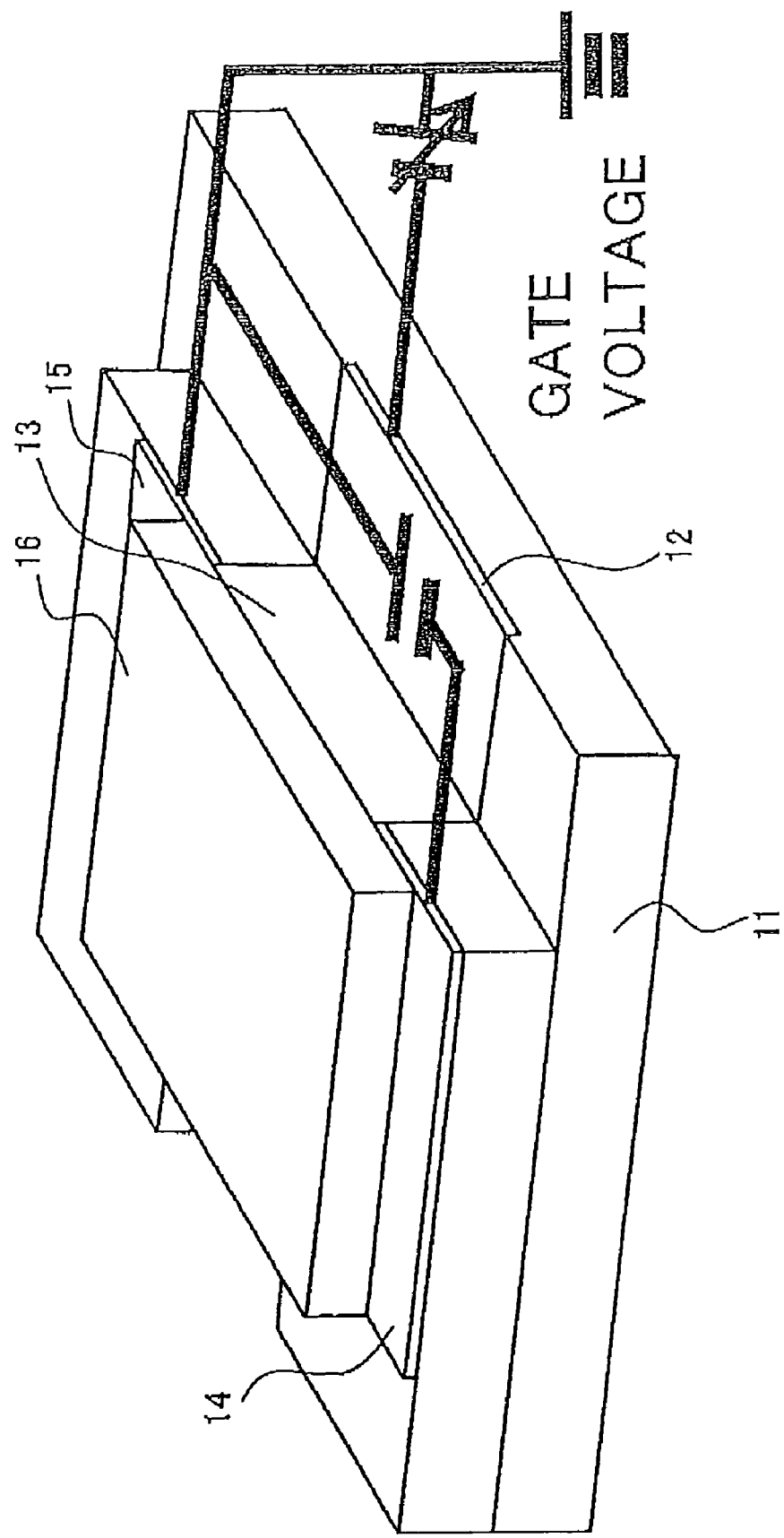
FIG. 8 is a schematic perspective of the transistor shown in FIGS. 6A and 6B in an operating state.
Figure 9:
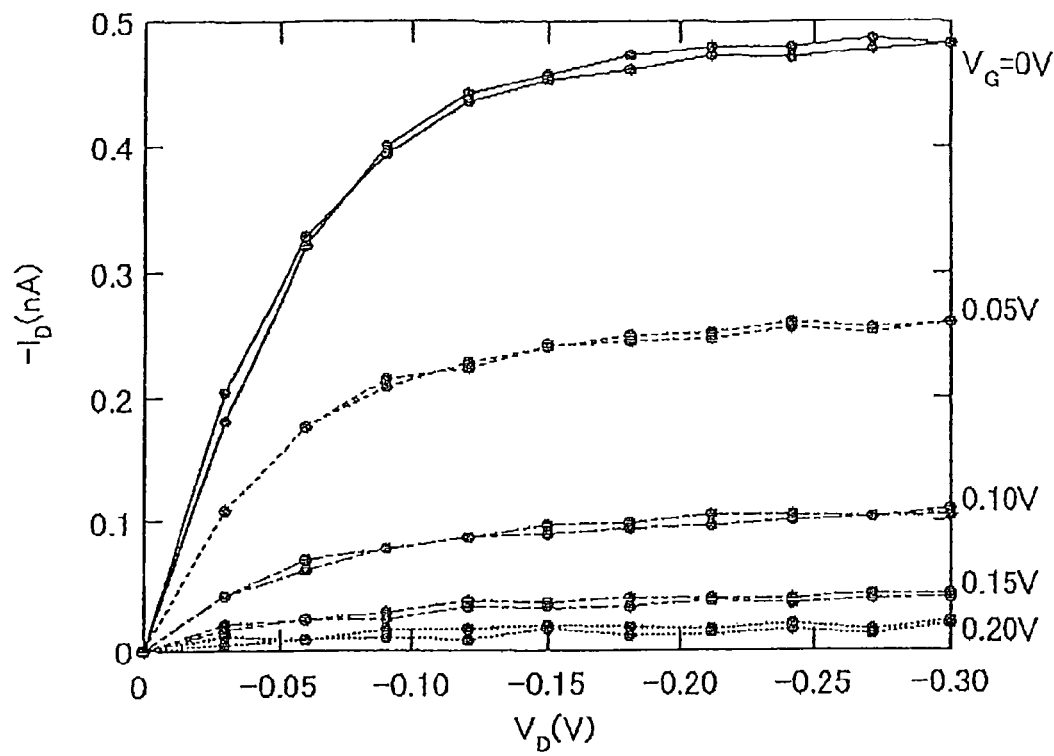
FIG. 9 is a graph illustrating the output characteristics of the transistor achieved in the second embodiment.
Figure 10:
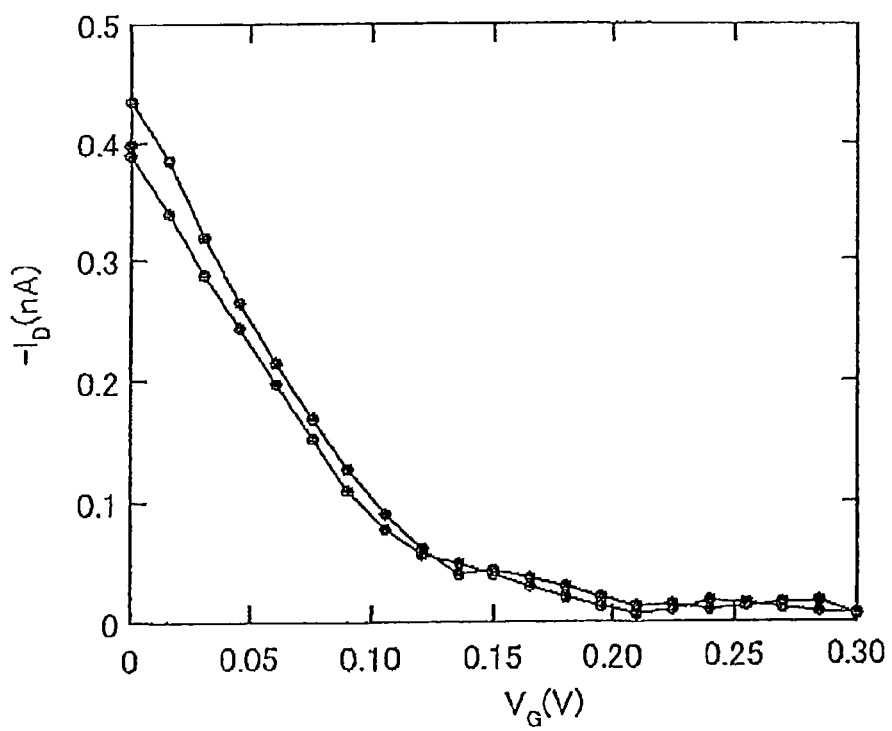
FIG. 10 is a graph illustrating the transfer characteristics of the transistor achieved in the second embodiment.

The characteristics of the organic field-effect transistor achieved in the second embodiment were measured using EMI($CF_3SO_2$)$_2$N and EMI($FSO_2$)$_2$N as the ionic liquid. FIG. 8 is a schematic perspective of the transistor in FIGS. 6A and 6B, illustrating the device in an operating state. FIG. 9 is a graph of the output characteristics of the transistor. FIG. 10 is a graph of the transfer characteristics of the transistor. The graph in FIG. 9 indicates the change in the current ($I_D$) that flows between the source electrode 14 and the drain electrode 15 in FIGS. 6A and 6B (output characteristics) observed by applying a drain voltage ($V_D$) between the source electrode 14 and the drain electrode 15. The results indicate that the transistor operates at a low drive voltage and demonstrates high current gain. The graph in FIG. 10 indicates the change in the current ($I_D$) that flows between the source electrode 14 and the drain electrode 15 (transfer characteristics) observed by applying a gate voltage ($V_G$) between the gate electrode 12 and the drain electrode 15 in FIGS. 6A and 6B. The results confirm that the transistor operates at a low drive voltage and demonstrates ample current gain.

Figure 11A:
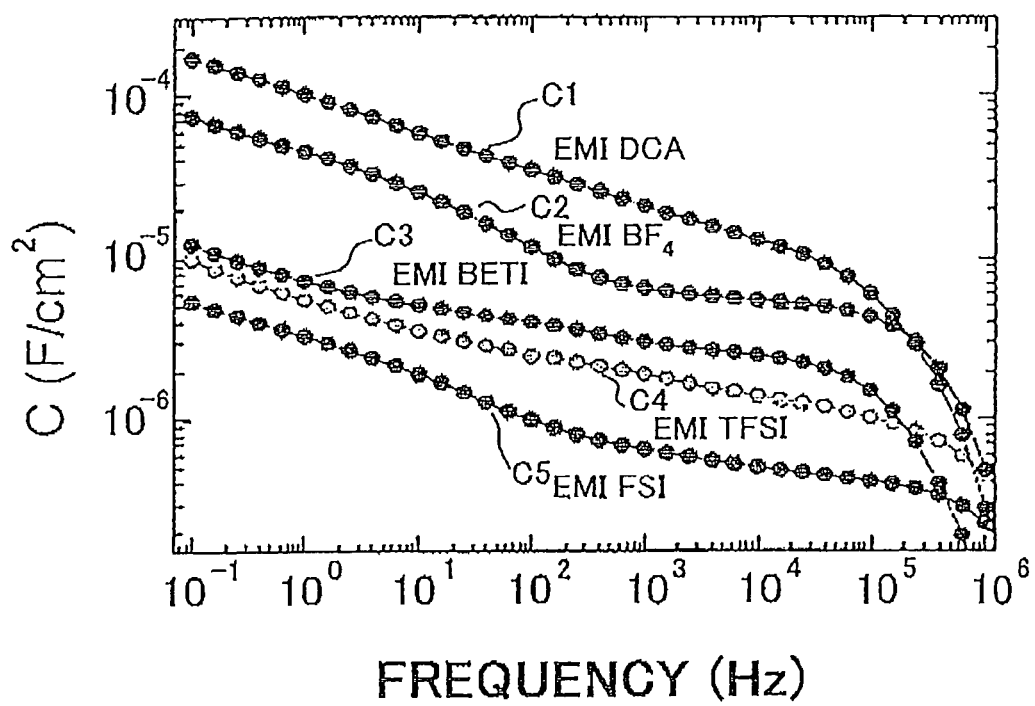
FIG. 11A is a graph facilitating comparison of frequency response characteristics of transistors assuming the structure in the first embodiment, produced using various ionic liquids.
Figure 11B:
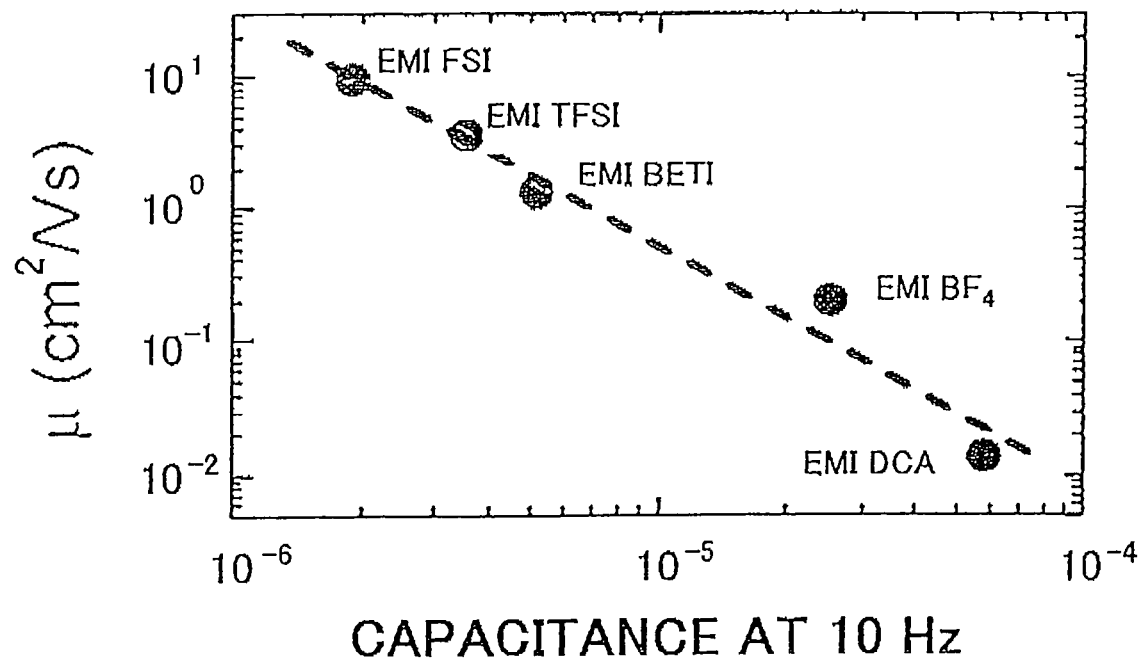
FIG. 11B is a graph illustrating the relationship between the mobility of the rubrene single crystal transistor and the capacitances of various ionic liquids in transistors assuming the transistor structure in the second embodiment.
Figure 12D:
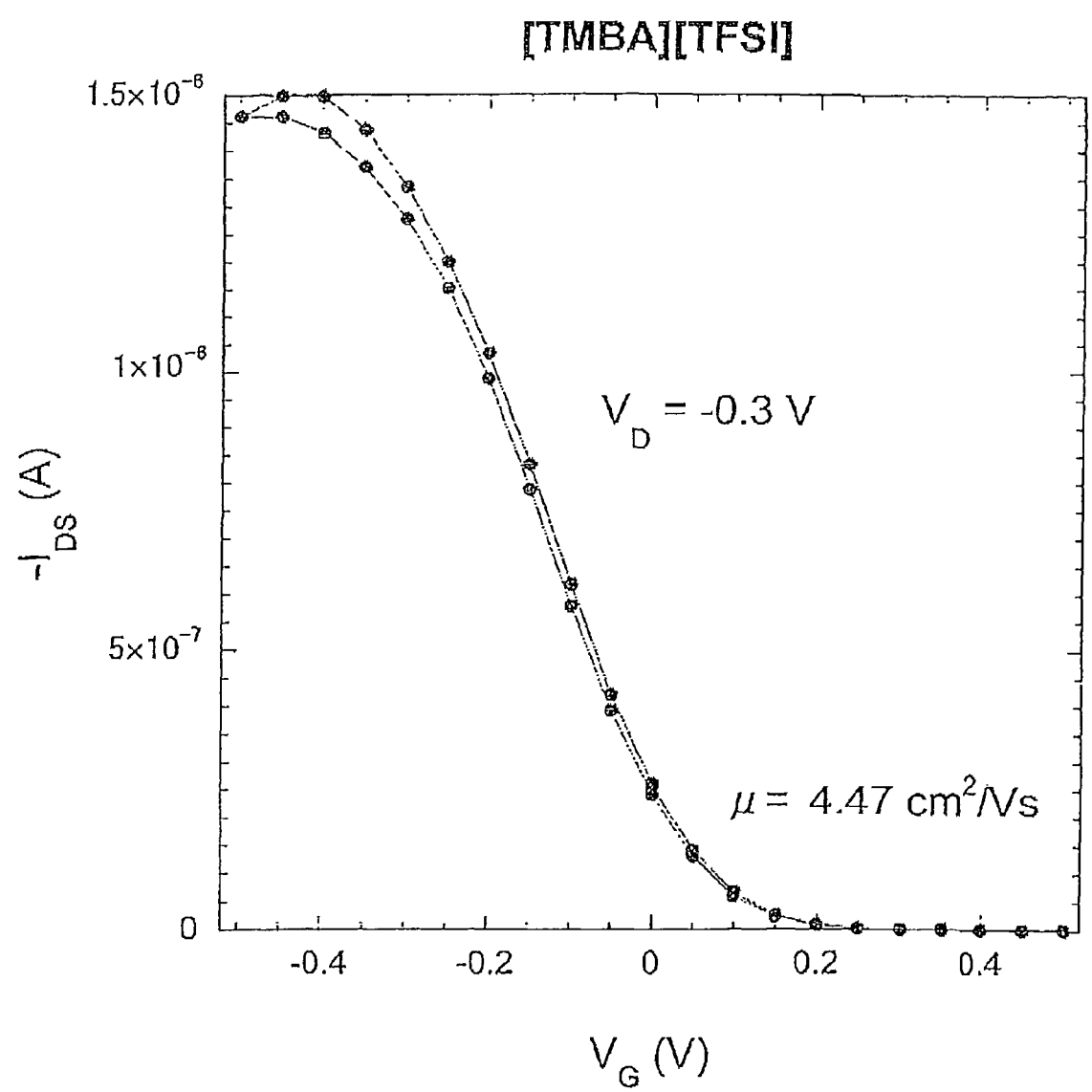
Figure 12E:
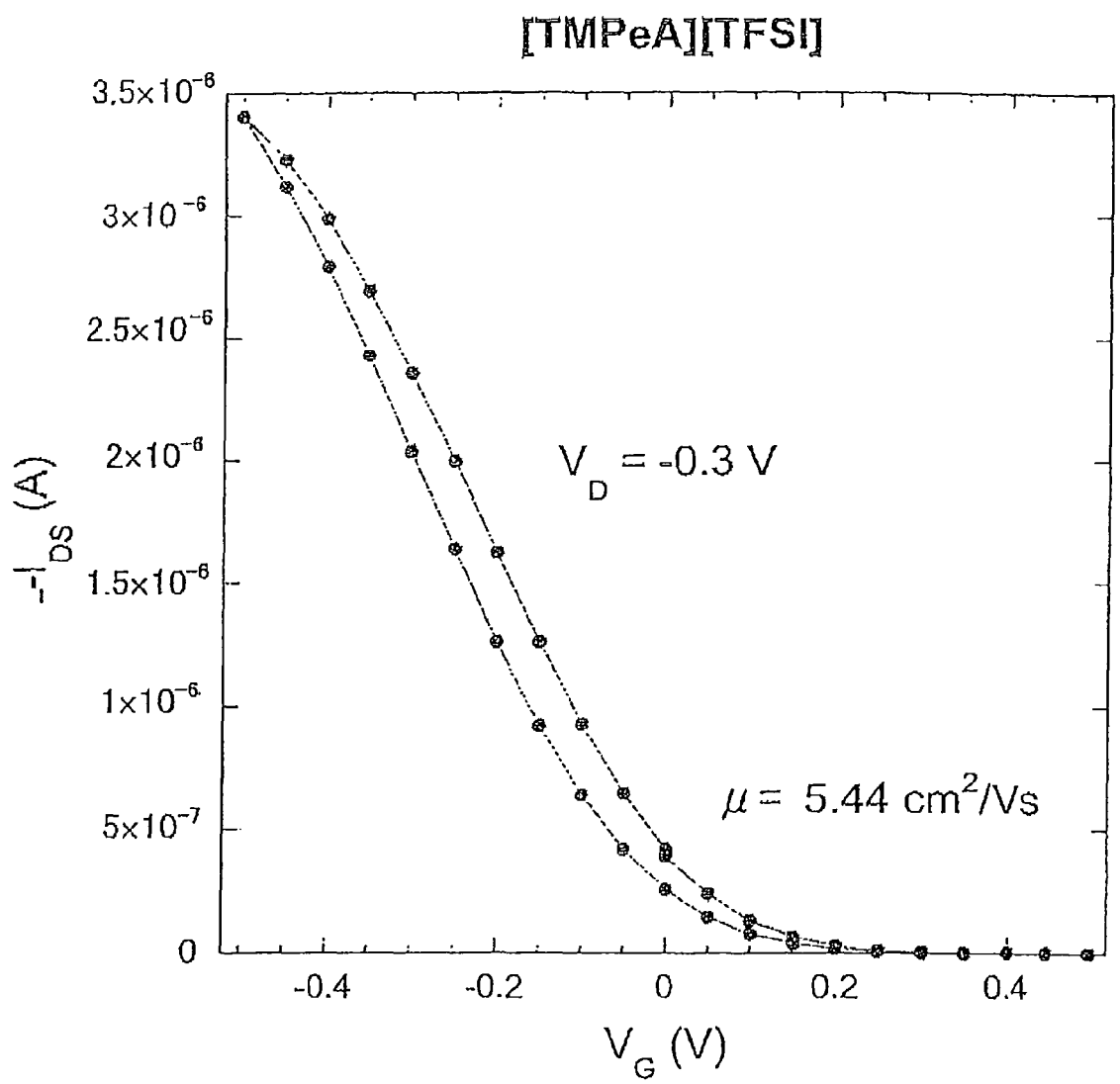

Similarly, the performance levels of EMI FSI, EMI TFSI, EMI BETI, EMI $BF_4$, and EMI DCA achieved in transistors adopting the transistor structure in the second embodiment were compared. The graph in FIG. 11A facilitates comparison of the frequency response characteristics of the transistors manufactured by using the various ionic liquids. Curves C1 to C5 represent EMI DCA, EMI $BF_4$, EMI BETI, EMI TFSI, and EMI FSI, respectively. A specific frequency of 0.1 MHz or higher was ached in conjunction with each ionic liquid. FIG. 11B is a graph of the relationship between the capacitances of the ionic liquids and the carrier mobility at a rubrene single crystal transistor. FIG. 11B indicates that an ionic liquid having a lower capacitance has higher carrier mobility and is, therefore, more advantageous in the development of high performance transistors.

Likewise, the transfer characteristics of the organic field-effect transistor achieved in the second embodiment were measured using [P13][TFSI], [P13][FSI], [PP13][TFSI], [TMBA][TFSI], or [TMPeA][TFSI] (FIG. 2B) as the ionic liquid. The results obtained are presented in FIGS. 12A to 12E. The graphs in FIGS. 12A to 12E indicate that a large current flows in the field-effect transistor in the second embodiment even in response to a very low applied voltage, which, in turn, indicates that the transistor can operate at a low voltage and demonstrate sufficiently high current gain.

As described above, the organic field-effect transistor according to the present invention operates at a low drive voltage and yet demonstrates ample current gain and high response speed. Thus, the transistor according to the present invention can be used as an amplifying element or a switching element.

Figure 13A:
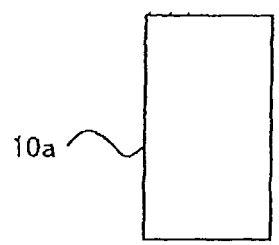
FIGS. 13A and 13B are conceptual diagrams, each showing a plan view of a depressed area formed to hold an ionic liquid.
Figure 13B:
Figure 14A:
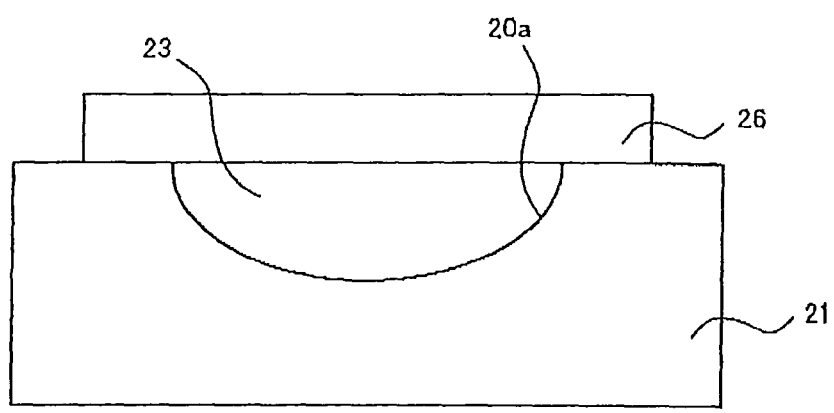
FIGS. 14A to 14C are conceptual diagrams, each showing a sectional view of a depressed area formed to hold an ionic liquid.
Figure 14B:
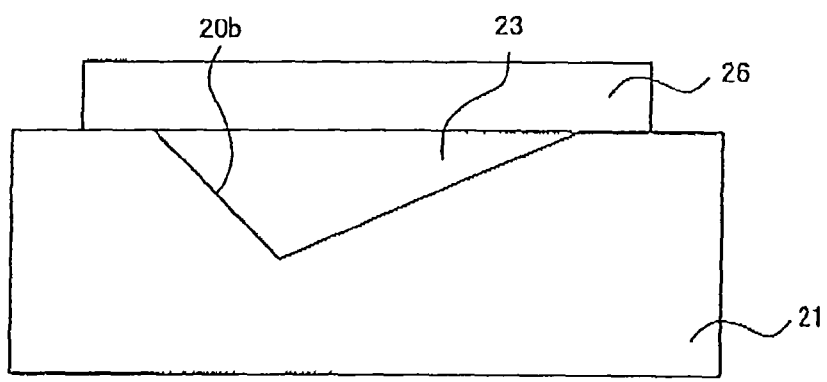
Figure 14C:
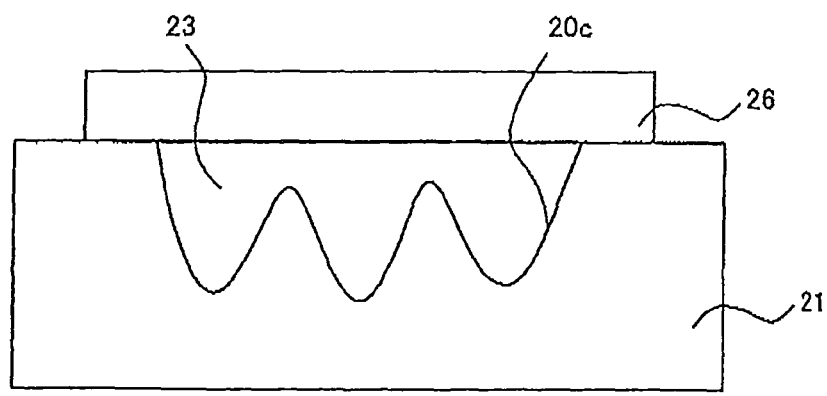

Within the scope of the present invention, various modifications may be made. For instance, the depressed area or groove may take a shape other than that described earlier and may assume a circular or elliptical shape (10b in FIG. 13B) viewed from above, instead of the rectangular shape 10a in FIG. 13A). The cross-sectional shape of the depressed area capable of generating capillary force in an ionic liquid 23, formed between an organic semiconductor layer 26 and the substrate 21 to hold the ionic liquid therein, may assume various shapes so long as the ionic liquid 23 can be securely held therein, as shown in FIGS. 14A to 14C. Namely, the sectional shape of the depressed area may be circular or elliptical (20a in FIG. 14A), triangular (20b in FIG. 14B), or corrugated (20c in FIG. 14C). In FIGS. 14 to 14C, the gate electrode is not shown.

While gold is used when forming the gate electrode, the source electrode, and the drain electrode in the embodiments described above, the present invention is not limited to these examples and any of the metals commonly used in gate electrodes, source electrodes and drain electrodes in field-effect transistors in the known art, such as platinum, silver, copper, titanium, chromium, nickel, and cobalt may also be used in conjunction with the present invention.

The field-effect transistor according to the present invention may adopt structures other than those described earlier. In addition, a composite circuit or device may be manufactured by combining various types of organic field-effect transistors. For example, as shown in FIG. 15, a composite circuit may be constructed by forming an organic CMOS element I and organic field-effect transistors II and III on a substrate 31 constituted of a plastic material. The organic CMOS I includes a field-effect transistor having a p-type organic semiconductor layer 36p formed therein and a field-effect transistor having an n-type organic semiconductor layer 36n formed therein in combination. The organic transistors II and III each assume a structure identical to that shown in FIGS. 6A and 6B. Namely, the organic field-effect transistors II and III are each formed by disposing a source electrode 34 and a drain electrode 35 on a substrate 31 so that the electrodes 34 and 35 face opposite each other across a groove 38 formed on the substrate 31, disposing a gate electrode 32 at the bottom of the groove 38 and disposing an organic semiconductor layer 36 above the groove 38 so as to bridge the electrodes 34 and 35. An ionic liquid 33 is then charged into the gap formed between the organic semiconductor layer 36 and the gate electrode 32 where capillary force is achieved. The organic field-effect transistors II and III are connected with each other via the common source electrode 34. The organic field transistor III is connected with the organic CMOS I through the drain electrode 35. The two ends of the groove 38 may be open ends at the organic field-effect transistor II or they may be sealed, as in the case of the organic field-effect transistor III. The gate electrode 32, extending along a side of the substrate 31, may range over the entire length of the side or the organic semiconductor layer. The groove 38 can be formed at the surface of the substrate 31 through lithography by using a mask with a predetermined pattern and chromium and gold, for instance, may be sequentially deposited into the bottom of the groove 38, to form the gate electrode 32, the source electrode 34 and the drain electrode 35 in sequence. The organic semiconductor layer 36 is disposed over the groove 38 so as to cover it (so as to bridge the source electrode 34 and the drain electrode 36). As a result, the space in the groove 38 covered by the organic semiconductor layer 36 is transformed into a gap (space) of specific dimensions, which allows capillary force to occur. For the organic CMOS I, the p-type organic semiconductor layer 36p and the n-type organic semiconductor layer 36n are disposed above the common groove 38 so as to cover the groove 38, thereby forming gaps of specific dimensions, which are determined such that capillary force can be determined therein. The ionic liquid 33 may separately charged into each of the gaps capable of generating capillary force in the organic semiconductor devices I, II, and III. Alternatively, the ionic liquid may be charged into each of the gaps simultaneously by immersing the substrate 31, having formed thereupon the devices I, II, and III in the ionic liquid 33 so as to allow the ionic liquid 33 to fill in the space through capillary force. It is to be noted that the space formed under each organic semiconductor layer may be sealed on both ends by insulating plates or an insulating adhesive to create a closed space. The ionic liquid in the space will be held therein more reliably affording a more stabilized operation environment for the device.

The present invention is not particularly limited to field-effect transistor applications and may be adopted in various field-effect devices, such as resistors, diodes, thyristors, memory devices, and sensors, as far as they include a substrate, a plurality of electrodes disposed on the substrate, an insulating layer constituted of a material containing an ionic liquid as a main component thereof, and an organic semiconductor crystal.

What is claimed is:

1. A field-effect transistor comprising:
   a source electrode and a drain electrode;
   an organic semiconductor layer in contact with the source electrode and the drain electrode;
   a gate insulating layer adjacent to the organic semiconductor layer; and
   a gate electrode in contact with the gate insulating layer, wherein:
   the gate insulating layer is in a liquid state with a viscosity that is equal to 150 mPas (millipascals per second) or less at room temperature and is constituted of an ionic liquid as a sole or main component thereof.

2. The field-effect transistor according to claim 1, wherein:
   the gate electrode is separated from the organic semiconductor layer over a specific gap which is determined such that capillary force can be achieved.

3. The field-effect transistor according to claim 2, wherein:
   the ionic liquid is held within closed space formed at the field-effect transistor.

4. The field-effect transistor according to claim 1, wherein:
   the ionic liquid is held in the field-effect transistor by capillary force.

5. The field-effect transistor according to claim 1, wherein:
   the ionic liquid is held within closed space formed at the field-effect transistor.

6. The field-effect transistor according to claim 1, wherein:
   a capacitance of the ionic liquid corresponding to a gate voltage modulation frequency of 10 Hz is reduced to 1/10 at a frequency of 10 kHz or higher.

7. The field-effect transistor according to claim 6, wherein:
   the ionic liquid is free of glue and thickener.

8. The field-effect transistor according to claim 7, wherein:
   the organic semiconductor is either a rubrene or a pentacene.

9. The field-effect transistor according to claim 1, wherein:
   the organic semiconductor is either a rubrene or a pentacene.

10. The field-effect transistor according to claim 1, wherein:
    the ionic liquid is free of glue and thickener.

11. The field-effect transistor according to claim 1, wherein:
    the ionic liquid contains nano particles of an inorganic oxide.

12. The field-effect transistor according to claim 1, wherein:
    the gate insulating layer in the liquid state contains inorganic ions.

13. The field-effect transistor according to claim 1, wherein:
    a cation constituting the ionic liquid is selected from imidazolium cations, pyrrolidinium cations, piperidinium cations, ammonium cations, and pyrazolium cations.

14. The field-effect transistor according to claim 1, wherein:
    the ionic liquid is constituted with a cation selected from 1-methyl-3-methylimidazolium, 1-ethyl-3-methylimidazolium, 1-propyl-3-methylimidazolium, 1-butyl-3-methylimidazolium, 1-pentyl-3-methylimidazolium, 1-hexyll-3-methylimidazolium, 1-octyl-3-methylimidazolium, 1,2-dimethyl-3-propylimidazolium, 1-methyl-1-propylpyrrolidinium, 1-methyl-1-butylpyrrolidinium, 1-butyl-1-methylpyrrolidinium, 1-methyl-1-propylpiperidinium, trimethyl propyl ammonium, trimethyl octyl ammonium, trimethyl hexyl ammonium, trimethyl pentyl ammonium, and trimethyl butyl ammonium, 1-ethyl-2,3,5-trimethylpyrazolium, 1-butyl-2,3,5-trimethylpyrazolium and 1-propyl-2,3,5-trimethylpyrazolium; and an anion selected from bis(trifluoromethanesulfonyl)imide, bis(fluorosulfonyl)imide, bis(perfluoroethylsulfonyl)imide, tetrafluoroborate, hexafluorophosphate, and dicyanoamine.

15. The field-effect transistor according to claim 14, wherein:

the ionic liquid is selected from;
1-ethyl-3-methylimidazolium bis(trifluoromethanesulfonyl)imide, 1-ethyl-3-methylimidazolium bis(fluorosulfonyl)imide, 1-ethyl-3-methylimidazolium bis(perfluoroethylsulfonyl)imide, 1-ethyl-3-methylimidazolium tetrafluoroborate, 1-ethyl-3-methylimidazolium dicyanoamine, 1-methyl-1-propylpyrrolidinium bis(trifluoromethanesulfonyl)imide, 1-methyl-1-propylpyrrolidinium bis(fluorosulfonyl)imide, 1-methyl-1-propylpiperidinium bis(trifluoromethanesulfonyl)imide, trimethylbutylammonium bis(trifluoromethanesulfonyl)imide, and trimethylpentylammonium bis(trifluoromethanesulfonyl)imide.

16. The field-effect transistor according to claim 15, wherein:

the ionic liquid is selected from;
1-ethyl-3-methylimidazolium bis(trifluoromethanesulfonyl)imide and 1-ethyl-3-methylimidazolium bis(fluorosulfonyl)imide.

17. The field-effect transistor according to claim 1, further comprising:

a substrate upon which the source electrode, the drain electrode, and the gate electrode are disposed.

18. The field-effect transistor according to claim 1, wherein:

the substrate is elastic.

19. An organic field-effect device that includes an field-effect transistor according to claim 1.

20. An intermediate structural body for producing an organic field-effect transistor, comprising:

a source electrode;
a drain electrode;
an organic semiconductor layer in contact with the source electrode and the drain electrode; and
a gate electrode in contact with the gate insulating layer, wherein:
the gate insulating layer is in a liquid state with a viscosity that is equal to 150 mPas (millipascals per second) or less at room temperature and is constituted of an ionic liquid as a sole or main component thereof, and
a gate electrode separated from the organic semiconductor layer over a specific gap which is determined such that capillary force can be obtained for a liquid electrolyte constituted of an ionic liquid.

21. An intermediate structural body, comprising:

a substrate with a depressed area of a predetermined depth on a surface thereof which is determined such that capillary force can be achieved in a liquid electrolyte with a viscosity that is equal to 150 mPas (millipascals per second) or less at room temperature and having an ionic liquid as a sole or main component thereof;
a source electrode and a drain electrode formed on a surface of the substrate so as to face opposite each other across the depressed area; and
a gate electrode formed on a bottom surface of the depressed area.

22. The intermediate structural body according to claim 21, wherein:

the substrate is elastic.

* * * * *